(12) United States Patent
Nakajima et al.

(10) Patent No.: US 9,812,348 B2
(45) Date of Patent: Nov. 7, 2017

(54) MEMBER PEELING METHOD, MEMBER PROCESSING METHOD, AND METHOD FOR MANUFACTURING SEMICONDUCTOR CHIP

(71) Applicant: 3M INNOVATIVE PROPERTIES COMPANY, St. Paul, MN (US)

(72) Inventors: Shinya Nakajima, Chofu (JP); Kazuta Saito, Tokyo (JP)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/105,597

(22) PCT Filed: Dec. 15, 2014

(86) PCT No.: PCT/US2014/070277
§ 371 (c)(1),
(2) Date: Jun. 17, 2016

(87) PCT Pub. No.: WO2015/095015
PCT Pub. Date: Jun. 25, 2015

(65) Prior Publication Data
US 2016/0351431 A1    Dec. 1, 2016

(30) Foreign Application Priority Data

Dec. 20, 2013  (JP) .................... 2013-264446

(51) Int. Cl.
*H01L 21/683*  (2006.01)
*H01L 21/268*  (2006.01)

(52) U.S. Cl.
CPC ........ *H01L 21/6836* (2013.01); *H01L 21/268* (2013.01); *H01L 21/6835* (2013.01);
(Continued)

(58) Field of Classification Search
CPC ............... H01L 21/6836; H01L 21/268; H01L 21/6835; H01L 21/76259; H01L 2221/6834
See application file for complete search history.

(56) References Cited

U.S. PATENT DOCUMENTS

| 8,113,914 | B2 | 2/2012 | Ohashi | |
| 2011/0297771 | A1* | 12/2011 | Noda | B32B 43/006 241/65 |
| 2012/0217501 | A1 | 8/2012 | Takayama | |

FOREIGN PATENT DOCUMENTS

| JP | 2003-324142 | 11/2003 |
| JP | 2004-064040 | 2/2004 |
| WO | 2013-112270 | 8/2013 |

OTHER PUBLICATIONS

International Search report for PCT International Application No. PCT/US2014/70277 dated Mar. 16, 2015, 4 pages.

* cited by examiner

*Primary Examiner* — Benjamin Sandvik
*Assistant Examiner* — Damon Hillman
(74) *Attorney, Agent, or Firm* — Adam Bramwell

(57) ABSTRACT

A member peeling method includes a step for preparing a first member having a first main face and an outer edge thereof and a second member having a second main face and an outer edge thereon, a step for disposing a photothermal conversion layer on at least one portion of the outer edge on the first main face, a step for mutually joining the first main face and the second main face via an adhesive layer, a step for irradiating a laser light to the photothermal conversion layer, and a step for at least partially peeling the first member from the second member by applying a force to an outer peripheral portion of either of the first member or the second member in a direction away from the other member.

12 Claims, 18 Drawing Sheets

(52) U.S. Cl.
CPC ............... *H01L 2221/6834* (2013.01); *H01L 2221/68318* (2013.01); *H01L 2221/68327* (2013.01); *H01L 2221/68381* (2013.01); *H01L 2221/68386* (2013.01)

US 9,812,348 B2

MEMBER PEELING METHOD, MEMBER PROCESSING METHOD, AND METHOD FOR MANUFACTURING SEMICONDUCTOR CHIP

CROSS REFERENCE TO RELATED APPLICATIONS

This application is a national stage filing under 35 U.S.C. 371 of PCT/US2014/070277, filed Dec. 15, 2014, which claims the benefit of JP Application No. 2013-264446, filed Dec. 20, 2013, the disclosure of which is incorporated by reference in its/their entirety herein.

TECHNICAL FIELD

The present invention relates to a member peeling method for mutually peeling a first member and a second member that are mutually joined. The present invention also relates to a member processing method for performing a required process on one of the first member and the second member that are mutually joined. The present invention also relates to a method for manufacturing a semiconductor chip that uses the member processing method.

BACKGROUND ART

Mutually peeling the first member and the second member that are mutually joined and carrying out a required process on one of the first member and the second member that are mutually joined is implemented in various fields. For example, in a method for manufacturing a semiconductor chip, after forming a circuit on one surface of a wafer having a predetermined thickness, grinding the back surface on the opposite side of the circuit surface (referred to below as the circuit surface) and uniformly reducing the thickness of the wafer after pasting a support such as a protective film or a glass plate on the circuit face is known. The wafer thinned by this back surface grinding process is generally peeled from the support before being sent to a post-process such as dicing.

For example, Patent Document 1 discloses a semiconductor wafer processing method that can peel a semiconductor wafer supported on a supporting substrate via two-sided adhesive tape from the supporting substrate. In Patent Document 1, it is written: "after supporting and fixing a semiconductor wafer W to a supporting substrate 16 via adhesive layers 18 and 20 of a two-sided adhesive tape 14, predetermined processes such as, for example, grinding, etching, and dicing are performed on the semiconductor wafer W as illustrated in step S3 of FIG. 1." (Paragraph 0030); "after performing the predetermined processes on the semiconductor wafer while supported and fixed to the supporting substrate 16, an irradiation of ultraviolet light is carried out to reduce peeling force, particularly when the adhesive layers 18 and 20 provided on both faces of the two-sided adhesive tape 14 are ultraviolet curable adhesives." (Paragraph 0031); "after a transfer tape T sandwiches a work 10 fixed between a guiding member 36 and a fixing table 32, allowing the transfer tape T to proceed along a guide surface 38 of the guiding member 36 that guides in a direction away from the supporting substrate 16 of the work 10 fixed to the fixing table 32, and transporting the work 10 fixed to the fixing table 32 along with the proceeding of the transfer tape T allows the semiconductor wafer W to peel from the supporting substrate 16 of the work 10 fixed to the fixing table 32 and is transferred to the transfer tape T." (Abstract).

Also, Patent Document 2 discloses a fragile member processing method that can stabilize and hold a fragile member when performing a process such as transporting or back surface grinding of a fragile member such as a semiconductor wafer, and can peel a fragile member without damaging it after the required processes are finished. In Patent Document 2, it is written: "a processing method for a fragile member 3 includes a step for re-peelably fixing the fragile member 3 on a flexible glass substrate 1, a step for performing a process on the fragile member 3, a step for fixing a side of the fragile member by a supporting means 11, and a step for curving the flexible glass substrate 1 and peeling it from the fragile member 3." (Abstract); "in order to curve and peel the flexible glass substrate 1, for example, the end portion of the flexible glass substrate 1 is held, and lifted from the fragile member 3 and is moved in the folding direction of the flexible glass substrate . . . . When using a peeling jig 30, as illustrated in FIG. 3, a lower insertion plate 33 is inserted between the fragile member 3 and a temporary attaching means 2, an upper movable plate 32 is dropped, and the end portion of the flexible glass substrate 1 is held by the lower insertion plate 33 and the upper movable plate 32. Afterwards, as illustrated in FIG. 3, the end portion is lifted from the fragile member 3, moved in the folding direction of the flexible glass substrate 1 and peeled while curving the flexible glass substrate 1." (Paragraph 0034).

RELATED ART DOCUMENTS

Japanese Unexamined Patent Application Publication No. 2003-324142
Japanese Unexamined Patent Application Publication No. 2008-306049

SUMMARY OF THE INVENTION

In a step such that peels a wafer from a support where a back surface grinding process is performed while joined to the support, a reliable technique that can peel quickly is desirable when mutually peeling the first member and the second member after performing necessary processes on one of the first member or second member that are mutually joined.

One aspect of the present invention is a member peeling method including a step for preparing a first member having a first main face and a second member having a second main face, a step for disposing a photothermal conversion layer on at least a portion of an outer edge of the first main face, a step for mutually joining the first main face and the second main face via an adhesive layer so that the photothermal conversion layer is disposed between the first main face and the second main face, a step for irradiating a laser light to the photothermal conversion layer, and a step for at least partially peeling the first member from the second member by applying a force to an outer peripheral portion of either member of the first member or the second member in a direction away from the other member of the first member or second member.

Another aspect of the present invention is a member processing method including a step for preparing a first member having a first main face and a second member having a second main face, a step for disposing a photothermal conversion layer, degradable by laser light irradiation, in a plane region along at least a portion of an outer edge of the first main face, the plane region being a portion of the first main face, a step for mutually joining the first main face, where the photothermal conversion layer is disposed on the plane region, and the second main face via a first adhesive layer, a step for carrying out a required process to either member of the first member or the second member where the first main face and the second main face are joined, a step for irradiating a laser light onto the photothermal conversion layer through the first member or the second member, and degrading the photothermal conversion layer, and a step for mutually peeling the first member and the second member, with a site corresponding to the plane region as a starting point, by flexing either one of the members in a direction away from the other member of the first or second member, while the first adhesion layer maintains an adhered state to the second main face.

Yet another aspect of the present invention is a manufacturing method for a semiconductor chip including a step for preparing a support having a wafer support surface and a wafer having a circuit surface including a circuit formation region, a step for disposing a photothermal conversion layer, degradable by laser light irradiation, in a plane region along at least a portion of an outer edge of the wafer support surface, the plane region being a portion of the wafer support surface, a step for mutually joining the wafer support surface, where the photothermal conversion layer is disposed in the plane region, and the circuit surface via the adhesive layer in a positional relationship where the plane region does not overlap with the circuit formation region, a step for carrying out a required process on the wafer where the circuit surface is joined to the wafer support surface, a step for irradiating a laser light onto the photothermal conversion layer through the support, and degrading the photothermal conversion layer, and a step for peeling the wafer from the support, by flexing the wafer in a direction away from the support, while the adhesive layer maintains an adhered state on the circuit surface, with a site corresponding to the plane region as a starting point.

According to the member peeling method according to one aspect of the present invention, by irradiating a laser light after the joining of the first main face and the second main face to the photothermal conversion layer disposed on the first main face before the first main face and the second main face are joined by the adhesive layer, the plane region not adhered to the adhesive layer can be formed along the outer edge of the first main face, and the first member can be peeled from the second member with the plane region as the starting point. During peeling, because the interfacial peeling of the first main face and the adhesive layer proceeds from the plane region, the first member can be surely and quickly peeled from the second member.

According to the member processing method according to another aspect of the present invention, by irradiating a laser light after the joining of the first main face and the second main face to the photothermal conversion layer disposed on the first main face before the first main face and the second main face are joined by the first adhesive layer, the plane region not adhered to the first adhesive layer can be formed along the outer edge of the first main face, and the first member and the second member can be mutually peeled with the plane region as the starting point. During peeling, because the interfacial peeling of the first main face and the first adhesive layer proceeds from the plane region, the first member and the second member can mutually, surely, and quickly be peeled. Particularly in the peeling step, because either one of the members having a process carried out is flexed in a direction away from the other member with a site corresponding to the plane region as the starting point, the interfacial peeling of the first main face and the first adhesive layer can easily and stably proceed from the plane region.

Further, because the photothermal conversion layer is disposed not on the entirety of the first main face of the first member, but on the plane region along at least one portion of the outer edge, the laser light that degrades that photothermal conversion layer may also be irradiated to only a site that corresponds to the plane region of the first member or the second member. By not irradiating the laser light on the entirety of the first member and the second member, effects of the radiant energy of the laser light on the first member or the second member can be reduced. Furthermore, the materials of the photothermal conversion layer can reduce the consumption of power and the like of the laser light L.

According to the method for manufacturing a semiconductor chip according to yet another embodiment of the present invention, by irradiating the laser light after the joining of the wafer support surface and the circuit surface to the photothermal conversion layer disposed on the wafer support surface before the wafer support surface and the circuit surface are joined by the first adhesive layer, the plane region not adhered to the adhesive layer can be formed along the outer edge of the wafer support surface, and the wafer can be peeled from the support with the plane region as the starting point. During peeling, because the interfacial peeling of the wafer support surface and the adhesive layer proceeds from the plane region, the wafer can be surely and quickly peeled from the support. Particularly in the peeling step, because the wafer having a process carried out is flexed in a direction away from the support with a site corresponding to the plane region as the starting point, the interfacial peeling of the wafer support surface and the adhesive layer can easily and stably proceed from the plane region.

Further, because the photothermal conversion layer is disposed not on the entirety of the wafer support surface of the support, but on the plane region along at least one portion of the outer edge, the laser light that degrades that photothermal conversion layer may also be irradiated to only a site that corresponds to the plane region of the support or the wafer. By not irradiating the laser light on the entirety of the support and the wafer, effects of the radiant energy of the laser light on the support or the wafer (particularly the circuit formation region) can be reduced. Furthermore, the materials of the photothermal conversion layer can reduce the consumption of power and the like of the laser light.

BEST MODE FOR CARRYING OUT THE INVENTION

Figure 1A:
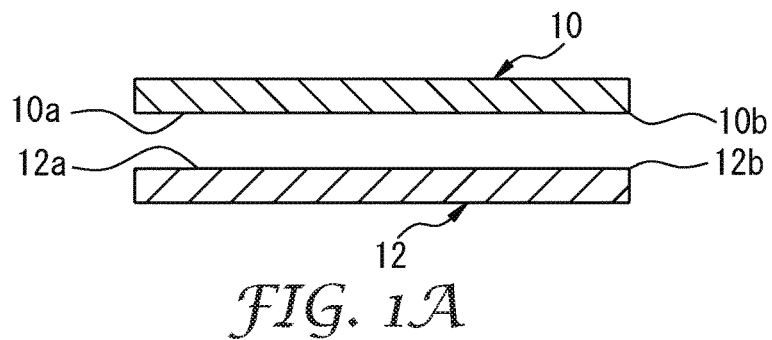
FIG. 1A is a cross-sectional view schematically illustrating one step of the member peeling method of the first embodiment.
Figure 1B:
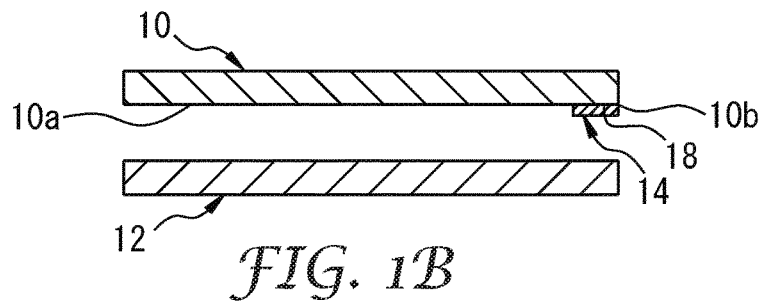
FIG. 1B is a cross-sectional view schematically illustrating another step of the member peeling method of the first embodiment.
Figure 1C:
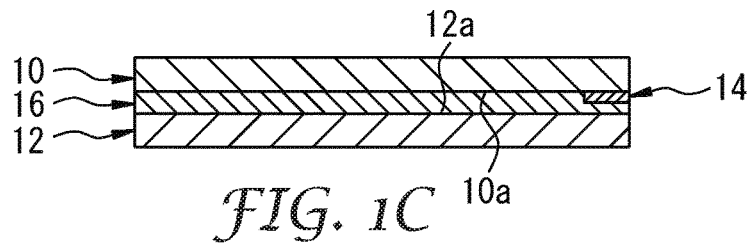
FIG. 1C is a cross-sectional view schematically illustrating yet another step of the member peeling method of the first embodiment.

Below, embodiments of the present invention will be described in detail with reference to the accompanying drawings. In all the drawings, corresponding elements have the same reference numerals. FIGS. 1A to 1E schematically illustrate an embodiment of a member peeling method according to the first embodiment of the present invention.

Figure 1D:
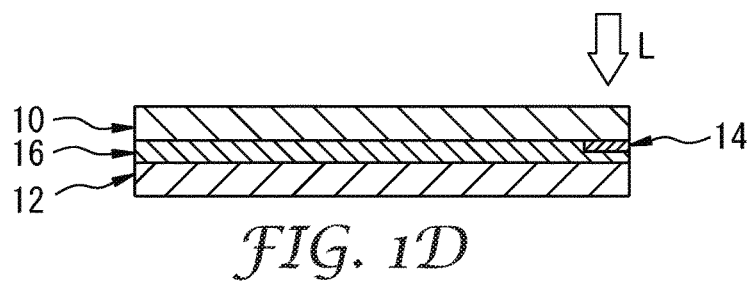
FIG. 1D is a cross-sectional view schematically illustrating yet another step of the member peeling method of the first embodiment.
Figure 1E:
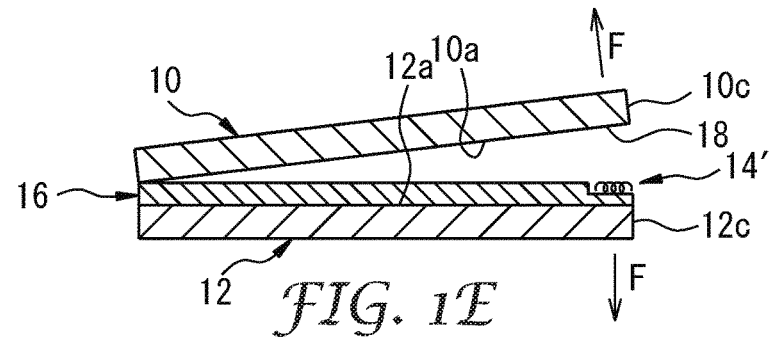
FIG. 1E is a cross-sectional view schematically illustrating yet another step of the member peeling method of the first embodiment.

The member peeling method of the present embodiment includes a step for preparing a first member 10 having a first main face 10a and an outer edge 10b thereof and a second member 12 having a second main face 12a and an outer edge 12b thereof (FIG. 1A), a step for disposing a photothermal conversion layer 14 on at least one portion of the outer edge 10b on the first main face 10a (FIG. 1B), a step for mutually joining the first main face 10a and the second main face 12a via an adhesive layer 16 so the photothermal conversion layer 14 is disposed between the first main face 10a and the second main face 12b, (FIG. 1C), a step for irradiating a laser light L to the photothermal conversion layer 14 (FIG. 1D), and a step for applying a force F to an outer peripheral portion 10c or 12c of one of either the first member 10 or the second member 12 in a direction away from the other member of the first member 10 or the second member 12 and at least partially peeling the first member 10 from the second member 12 (FIG. 1E).

The first member 10 and the second member 12 can each have various external shapes such as a plate shape, a rod shape, a rectangle shape, a convex shape, or a concave shape. Also, the first main face 10a and the second main face 12a can each have various surface shapes such as a plane surface, a curved surface, or a convex/concave surface. Also, the outer edge 10b and the outer edge 12b can each have various outlines such as a polygon shape, a circular shape, or an elliptical shape. In the present embodiment, the outer peripheral portion 10c and the outer peripheral portion 12c refer to portions including the outer periphery and outer peripheral portions of the first member 10 and the second member 12. Note that the first member 10 and the second member 12 can both have different shapes.

The first member 10 and the second member 12 may have elasticity that flexes moderately without bending back and forth (in other words plastically deforming) when receiving the force F in the peeling step (FIG. 1E), and may also maintain its shape resisting the force F, or bend back and forth due to the force F without moderate elasticity. It is desirable for the first member 10 to have optical transparency with respect to the laser light L for the laser light irradiation step (FIG. 1D). The second member 12 may have optical transparency. The material of the first member 10 and the second member 12 are not particularly limited.

The photothermal conversion layer 14 includes a light absorbing agent and a thermally-degradable resin as components, and is composed of materials degradable by the irradiation of the laser light L in the laser light irradiation step (FIG. 1D). The radiant energy irradiated to the photothermal conversion layer 14 in the form of laser light is absorbed by the light absorbing agent and converted to thermal energy. The thermal energy generated greatly raises the temperature of the photothermal conversion layer, and the thermally-degradable resin is thermally degraded when that temperature reaches the thermal degradation temperature of the thermally-degradable resin. Gas generated by the thermal degrading forms a void in the photothermal conversion layer 14, and as a result, the photothermal conversion layer is degraded and loses its layer shape.

Figure 2A:
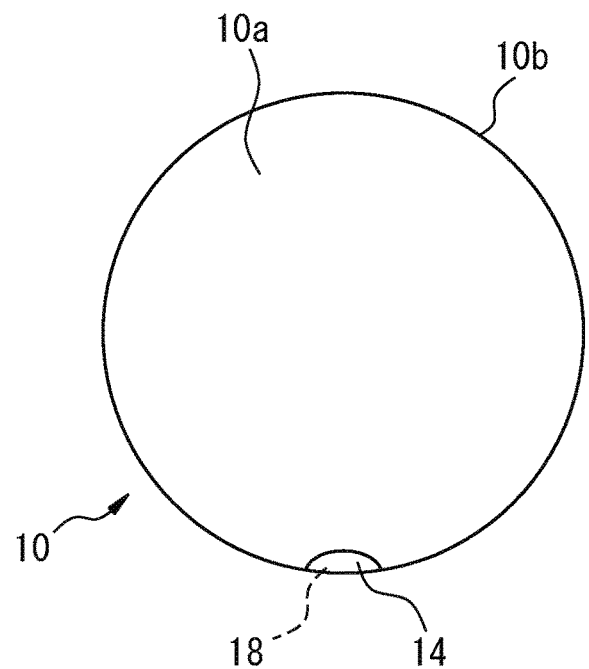
FIG. 2A is a plan view schematically illustrating the embodiment of the step in FIG. 1B.
Figure 2B:
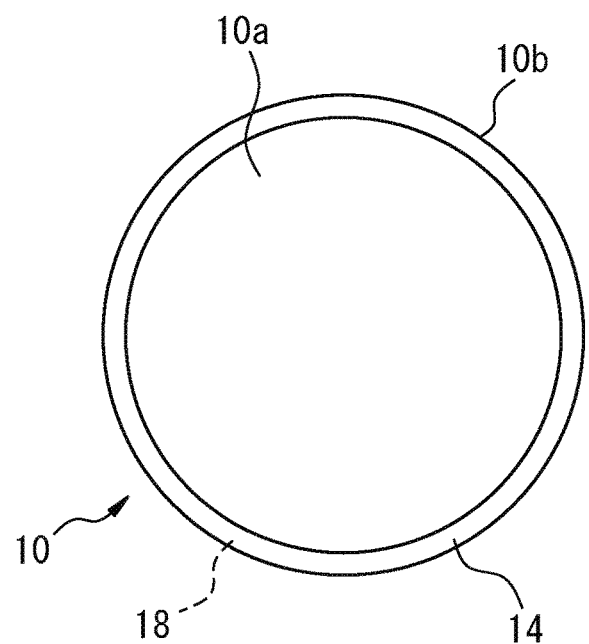
FIG. 2B is a plan view schematically illustrating another embodiment of the step in FIG. 1B.
Figure 3A:
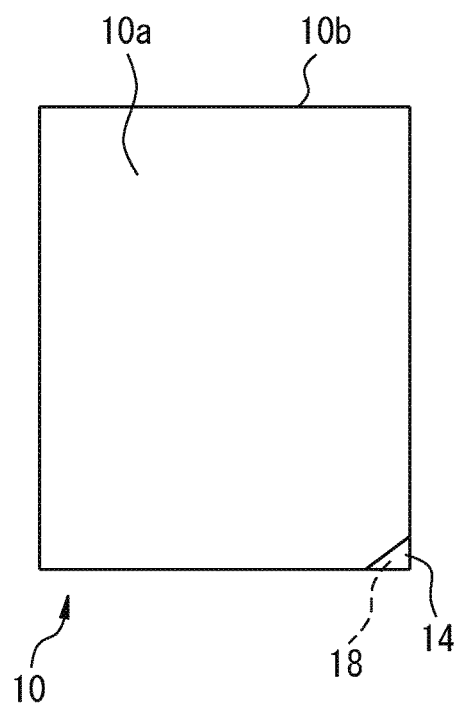
FIG. 3A is a plan view schematically illustrating yet another embodiment of the step in FIG. 1B.
Figure 3B:
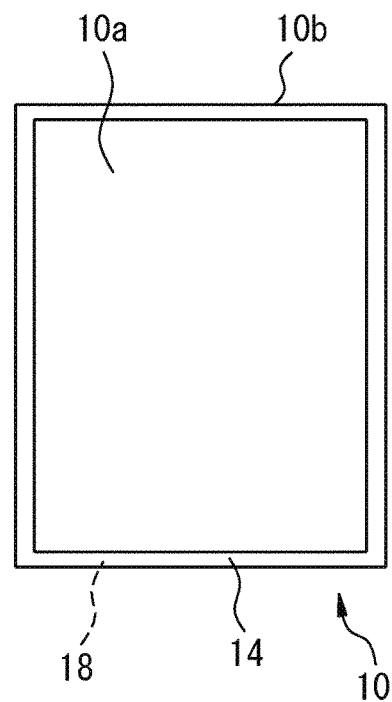
FIG. 3B is a plan view schematically illustrating yet another embodiment of the step in FIG. 1B.

The photothermal conversion layer 14 is disposed on the plane region 18 along at least one portion of the outer edge 10b of the first main face 10a, the plane region 18 being a portion of the first main face 10a. The photothermal conversion layer 14 is formed through processes such as drying, ultraviolet curing after a liquid material (or in other words, a precursor) composed by mixing light absorbing agent, a thermally-degradable resin, and a solvent is applied to the plane region 18. The plane region 18, as illustrated in FIGS. 2A and 2B, may be defined in a spot shape along one portion of the outer edge 10b of a circular first main face 10a (FIG. 2A), and may be defined in an annular shape along the entirety of the outer edge 10b (FIG. 2B). Moreover, a plurality of spot shaped plane regions 18 may be defined in a plurality of desired sites of the outer edge 10b, and an annular plane region 18 may be split in one or more desired sites on the outer edge 10b. The photothermal conversion layer 14 may be disposed on these spot-shaped, annular-shaped, and like-shaped plane regions 18. The plane region 18 also, as illustrated in FIGS. 3A and 3B, may be defined in a spot shape along one portion (a corner in the drawing) of the outer edge 10b of a polygonal first main face 10a (FIG. 3A), and may be defined in an annular shape along the entirety of the outer edge 10b (FIG. 3B). Moreover, a plurality of spot shaped plane regions 18 may be defined in a plurality of desired sites of the outer edge 10b (for example, a plurality of corners), and an annular plane region 18 may be split in one or more desired sites on the outer edge 10b. The photothermal conversion layer 14 may be disposed on these spot-shaped, annular-shaped, and like-shaped plane regions 18.

In the joining step (FIG. 1C), the adhesive layer 16 separably joins the first main face 10a and the second main face 12a without damaging the first member 10 and the second member 12. When the first main face 10a and the second main face 12b have outer edges 10b and 12b with the same contour, the adhesive layer 16 joins the entirety of the first main face 10a to the entirety of the second main face 12a. When the first main face 10a and the second main face 12b have outer edges 10b and 12b with a different contour, the adhesive layer 16 joins at least the plane region 18 of the first main face 10a to the second main face 12a. The adhesive layer 16 is formed on one of or both of the surface of the photothermal conversion layer disposed on the plane region 18 and an exposed portion of the first main face 10a, and the second main face 12a through processes such as drying, and curing (such as ultraviolet curing) after a liquid adhesive (or in other words, a precursor) is applied and the liquid adhesive is sandwiched between the first member 10 and the second member 12. The adhesive layer 16, by curing or solidifying, can demonstrate an adhesive force that holds the surface of the photothermal conversion layer 14, the exposed portion of the first main face 10a, and the second main face 12a firmly fixed, and can be composed of a solvent-based adhesive, a thermoplastic resin including a hot-melt adhesive, a water-dispersible adhesive, and the like.

In the laser light irradiation step (FIG. 1D), the laser light L irradiates to the photothermal conversion layer 14 via the first member 10 with a light wavelength that can be absorbed by the photothermal conversion layer 14 and with an output sufficient to degrade the photothermal conversion layer 14 by the generation of degrading gas when thermally degrading the thermally-degradable resin. When the second member 12 and the adhesive layer 16 have optical transparency with respect to the laser light L, the laser light L can be irradiated to the photothermal conversion layer 14 through the second member 12 and the adhesive layer 16. A YAG laser (wavelength of 1064 nm), a second harmonic YAG laser (wavelength of 532 nm), a semiconductor laser (wavelength of 780 nm to 1300 nm), and the like can be used as a light source for the laser light L.

By irradiating the laser light L to the photothermal conversion layer 14 in the laser irradiating step (FIG. 1D) with respect to the first member 10 and the second member 12 that have the first main face 10A and the second main face 12A joined via the adhesive layer 16 in the joining step (FIG. 1C), as described above, the photothermal conversion layer 14 degrades and loses its layer shape, and transforms into a residual liquid substance 14'. In this state, the plane region 18 with the photothermal conversion layer 14 disposed is separated from the adhesive layer 16 so that it is difficult to rejoin because the residual liquid substance 14' exists. Here, in the peeling step (FIG. 1E), by applying a force F to a site, particularly corresponding to the plane region 18, that is the outer peripheral portion 10c of the first member 10 or the outer peripheral portion 12c of the second member 12, in a direction away from the other member 10 or 12, and an interfacial peeling of the adhesive layer 16 and the first main face 10a occurs with the plane region 18 not adhered to the first adhesive layer 26 as the starting point, and the first member 10 is partially peeled from the second member 12 with the plane region 18 not adhered to the adhesive layer 16 as a starting point.

By continually applying a the force F to the outer peripheral portion 10c or the outer peripheral portion 12c after partially peeling the first member 10 from the second member 12, the interfacial peeling of the adhesive layer 16 and the first main face 10a gradually spreads from the plane region 18. When the entirety of the first main face 10a is interfacially peeled from the adhesive layer 16, the first member 10 is completely peeled from the second member 12. During this peeling step, the first member 10 and the second member 12 can maintain their shapes resisting the force F, elastically flex by the force F, or bend back and forth due to the force F.

By appropriately selecting the physical properties of the first member 10 and the second member 12, the surface characteristics of the first main face 10a and the second main face 12a, the materials of the adhesive layer 16, and the like, can be configured so that the attached state of the adhesive layer 16 to the second main face 2 can be maintained during the peeling step (FIG. E). By adhering the adhesive layer 16 to the second main face 12a, the interfacial peeling of the adhesive layer 16 and the first main face 10a proceeds smoothly, and the first member 10 is surely peeled from the second member 12.

Note that in the peeling step (FIG. 1E), when applying the force F to the outer peripheral portion 10c or 12c of one member of the first member 10 and the second member 12, the other member 10 or 12 can be fixed by an appropriate jig.

Alternatively, the force F can be applied to the outer peripheral portions 10c and 12c of both of the first member 10 and the second member 12 in directions away from the other member.

According to the member peeling method described above, by irradiating the laser light L after the joining of the first main face 10a and the second main face 12a to the photothermal conversion layer 14 disposed on the first surface 10a before the first main face 10a and the second main face 12a are joined by the adhesive layer 16, the plane region 18 not adhered to the adhesive layer 16 can be formed along the outer edge 10b of the first main face 10a, and the first member 10 can be peeled from the second member 12 with the plane region 18 as the starting point. During peeling, because the interfacial peeling of the first main face 10a and the adhesive layer 16 proceeds from the plane region 18, the first member 10 can be surely and quickly peeled from the second member 12.

Further, because the photothermal conversion layer 14 is disposed not on the entirety of the first main face 10a of the first member 10, but on the plane region 18 along at least one portion of the outer edge 10b, the laser light L that degrades that photothermal conversion layer 14 may also be irradiated to only a site that corresponds to the plane region 18 of the first member 10 or the second member 12. By not irradiating the laser light L on the entirety of the first member 10 and the second member 12, effects of the radiant energy of the laser light L on the first member 10 or the second member 12 can be reduced. Furthermore, the materials of the photothermal conversion layer 14 can reduce the consumption of power and the like of the laser light L when irradiating the laser light L. Note that the plane region 18 that disposes the photothermal conversion layer 14 acts to promote the proceeding of the interfacial peeling of the first main face 10a and the adhesive layer 16 in accordance with the size of the total value of the peripheral dimension along the outer edge 10b of the first main face 10a. From this perspective, the annular photothermal conversion layer 14 can be disposed on the annular plane region 18 along the entirety of the outer edge 10b of the first main face 10a.

Here, specific examples of the light absorbing agent and the thermally-degradable resin included in the photothermal conversion layer will be described. For example, fine metal powders such as carbon black, graphite powder, iron, aluminum, copper, nickel, cobalt, manganese, chromium, zinc, and tellurium, metal oxide powders such as black titanium oxide, or pigments or dyes such as aromatic diamine metal complex, aliphatic diamine metal complex, aromatic dithiol metal complex, mercaptophenol metal complex, squarylium compound, cyanine dye, methine dye, napthoquinone dye, and anthraquinone dye can be used as a light absorbing agent used by the photothermal conversion layer 14. Alternatively, it may also be a film-like shape including a metal-deposited film. An appropriate material may be selected from the above based on the wavelength of the laser light L.

The concentration of the light absorbing agent in the photothermal conversion layer 14 differs depending on the type of light absorbing agent, particle shape, degree of dispersion, and the like, but with general carbon black with a particle size of 5 nm to 500 nm, the concentration is around 5% of the volume or more, and around 70% of the volume or less. When the concentration is less than 5% of the volume, the heat generation of the photoconversion layer 14 may be insufficient for degrading the thermally-degradable resin. Further, when the concentration exceeds 70% of the volume, film forming abilities of the photothermal conversion layer 14 may deteriorate, and adhering defects with the adjacent surface are likely to occur. Moreover, when the amount of carbon black is too large, the transmittance of the light for curing the adhesive layer 16 may decrease if a light curable (for example, ultraviolet curable) adhesive is used for the adhesive layer 16. Therefore, the concentration of carbon black can be, for example, about 10% of the volume greater, and, for example, about 15% of the volume or greater, and can be, for example, about 60% of the volume or less, and, for example, about 55% of the volume or less.

Gelatin, cellulose, cellulose esters (for example, cellulose acetate and nitrocellulose), polyphenols, polyvinyl butyral, polyvinyl acetal, polycarbonate, polyurethane, polyester, poly ortho ester, polyacetal, polyvinyl alcohol, polyvinylpyrrolidone, copolymer of vinylidene, chloride, and acrylonitrile, poly(meth)acrylate, polyvinyl chloride, block copolymer including silicon resin and/or a polyurethane unit, and the like can be used individually or in a combination of two or more as the thermally degradable resin. Moreover, to prevent the re-adhering of the photothermal conversion layer 14 that has formed and separated from the residual liquid substance 14' by the thermal degradation of the thermally degradable resin, it is desirable for the glass transition temperature of the resin to be room temperature (20° C.) or greater, and Tg can be, for example, about 50° C. or greater, and, for example, about 100° C. or greater.

With the member peeling method described above, the first member 10 and the second member 12 can be placed in various environments while the first main face 10a and the second main face 12a are joined by the adhesive layer 16. For example, if one of the members 10 or 12 is a support that fixedly supports the other member 10 or 12, a physical process, chemical process, decorating, drawing, writing, observation, and the like can be carried out on the other member 10 or 12, or the other member 10 or 12 can be used to perform some operation. After performing the desired act, the first member 10 can be peeled from the second member 12 by the method described above.

FIGS. 4A to 4F and FIGS. 5A to 5F schematically illustrate an embodiment of a member processing method according to the first embodiment of the present invention including the member peeling method described above.

Figure 4A:
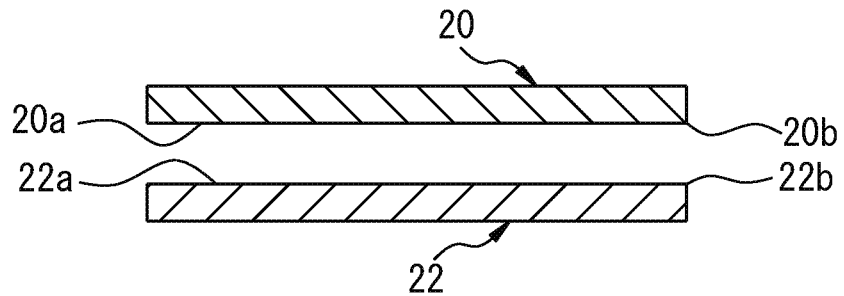
FIG. 4A is a cross-sectional view schematically illustrating one step of the member processing method of the first embodiment.
Figure 4B:
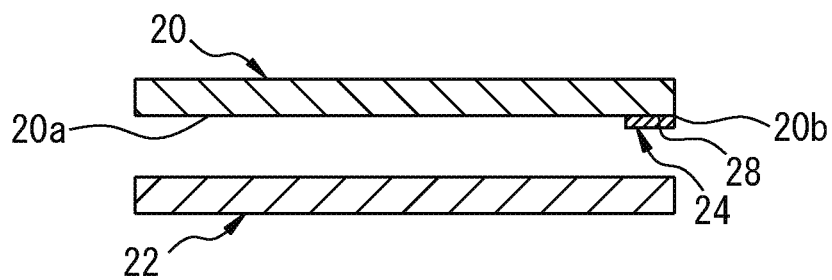
FIG. 4B is a cross-sectional view schematically illustrating another step of the member processing method of the first embodiment.
Figure 4C:
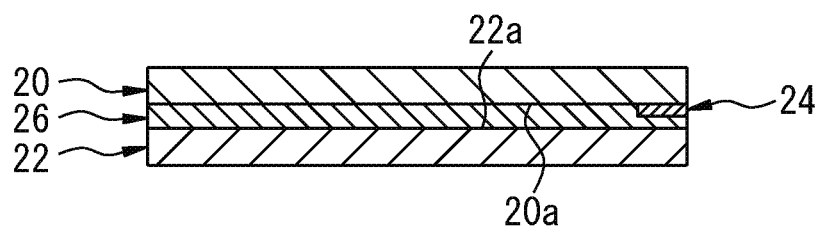
FIG. 4C is a cross-sectional view schematically illustrating yet another step of the member processing method of the first embodiment.
Figure 4D:
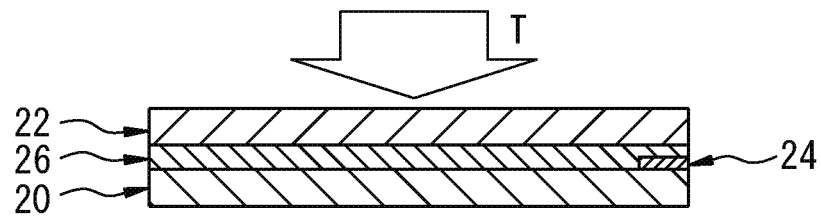
FIG. 4D is a cross-sectional view schematically illustrating yet another step of the member processing method of the first embodiment.
Figure 4E:
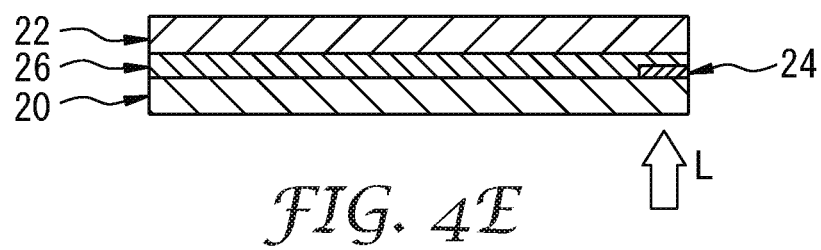
FIG. 4E is a cross-sectional view schematically illustrating yet another step of the member processing method of the first embodiment.
Figure 4F:
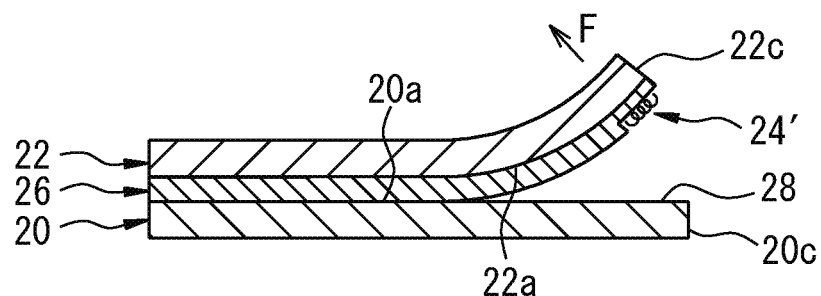
FIG. 4F is a cross-sectional view schematically illustrating yet another step of the member processing method of the first embodiment.
Figure 5A:
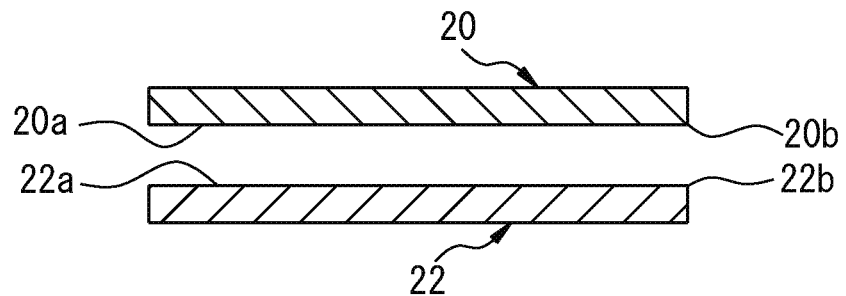
FIG. 5A is a cross-sectional view schematically illustrating one step of the member processing method of another embodiment.
Figure 5B:
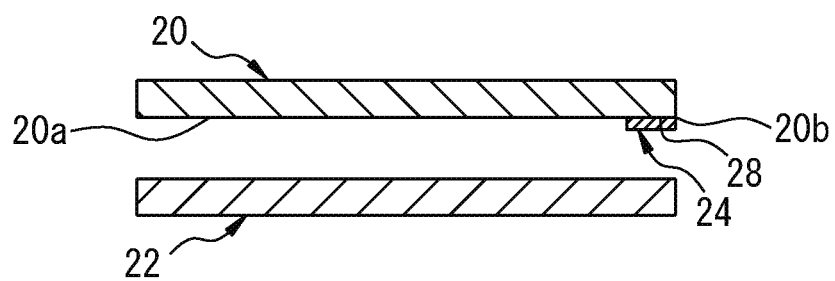
FIG. 5B is a cross-sectional view schematically illustrating another step of the member processing method of the other embodiment.
Figure 5C:
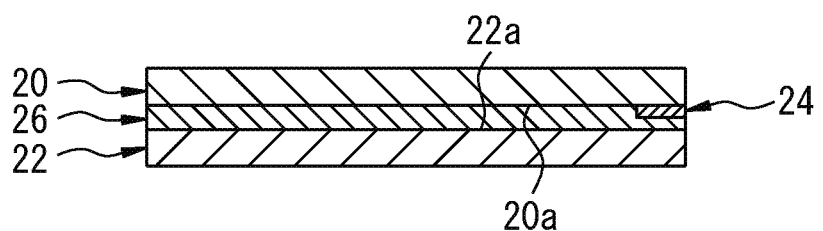
FIG. 5C is a cross-sectional view schematically illustrating yet another step of the member processing method of the other embodiment.
Figure 5D:
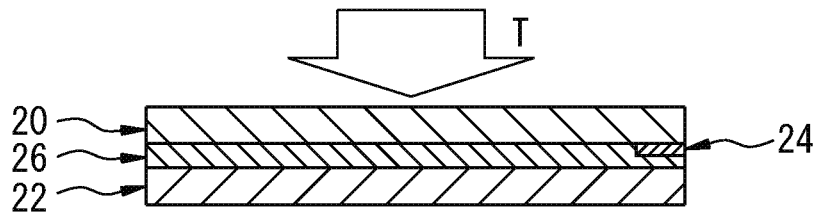
FIG. 5D is a cross-sectional view schematically illustrating yet another step of the member processing method of the other embodiment.
Figure 5E:
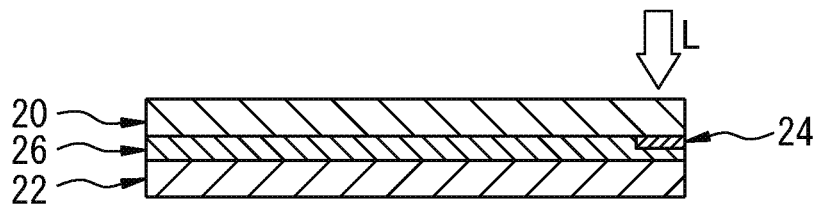
FIG. 5E is a cross-sectional view schematically illustrating yet another step of the member processing method of the other embodiment.
Figure 5F:
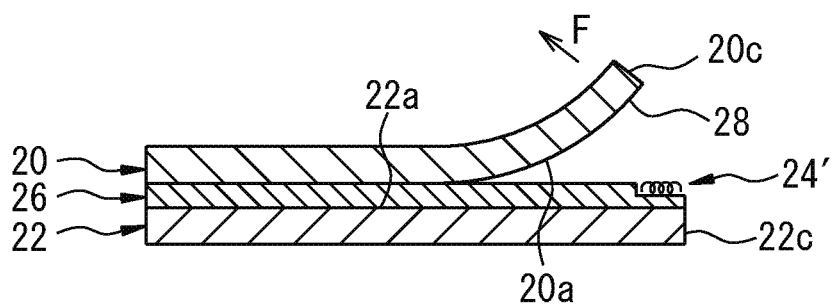
FIG. 5F is a cross-sectional view schematically illustrating yet another step of the member processing method of the other embodiment.

The member processing method according to the present embodiment includes a step for preparing a first member 20 having a first main face 20a and an outer edge 20b thereon and a second member 22 having a second main face 22a and an outer edge 22b thereon (FIG. 4A, FIG. 5A), a step for disposing a photothermal conversion layer 24 degradable by laser light irradiation on a plane region 28 as one portion of the first main face 20a, along at least one portion of the outer edge 20b of the first main face 20a (FIG. 4B, FIG. 5B), a step for mutually joining the first main face 20a with the photothermal conversion layer 24 disposed on the plane region 28 and the second main face 22a via an adhesive layer 26 so the photothermal conversion layer 24 is disposed between the first main face 20a and the second main face 22b, (FIG. 4C, FIG. 5C), a step for carrying out a required process T on one member of the first member 20 or the second member 22 with the first main face 20a and the second main face 22a joined (FIG. 4D, FIG. 5D), a step for irradiating a laser light L to the photothermal conversion layer 24 through the first member 20 or the second member 22 and degrading the photothermal conversion layer 24 (FIG. 4E, FIG. 5E), and a step for flexing one of the members 20 or 22 that had the process T carried out in a direction away from the other member of the first or second members 20 and 22 with a site corresponding to the plane region 28 as the starting point, and mutually peeling the first member 20 and the second member 22 while maintaining the adhesion of a first adhesive layer 26 to the second main face 22a (FIG. 4F, FIG. 5F). The peeling step (FIG. 4F, FIG. 5F) includes a step for applying a force F to an outer peripheral portion 20c or 22c of one of either the member 20 or the member 22 with the process T carried out, in a direction away from the other member between the members 20 and 22.

With the member processing method described above, the first member 20, the first main face 20a, the outer edge 20b, the outer peripheral portion 20c, the second member 22, the second main face 22a, the outer edge 22b, the outer peripheral portion 22c, the photothermal conversion layer 24, the first adhesive layer 26, the plane region 28, the laser light L and the force F are each components that correspond to the first member 10, the first main face 10a, the outer edge 10b, the outer peripheral portion 10c, the second member 12, the second main face 12a, the outer edge 12b, the outer peripheral portion 12c, the photothermal conversion layer 14, the adhesive layer 16, the plane region 18, the laser light L, and the force F in the member peeling method in FIG. 1 and FIG. 2, and descriptions thereof will thereby be generally omitted. However, with the member processing method described above, at least one of the first member 20 or the second member 22 has elasticity that flexes moderately without bending back and forth (in other words plastically deform) when receiving the force F in the peeling step (FIG. 4F, FIG. 5F).

With the embodiment illustrated in FIGS. 4A to 4F, the processing step (FIG. 4D) includes a step for carrying out the process T on the second member 22 (illustrated inverted in the vertical position relationship in FIG. 4C). Further, the laser light irradiation step (FIG. 4E) includes a step for irradiating the laser light L on the photothermal conversion layer 24 through the first member 20. Furthermore, the peeling step (FIG. 4F) includes a step for applying the force F to the outer peripheral portion 22c of the second member 22 having the process T carried out, in a direction away from the first member 20 flexing the second member 22 in a direction away from the first adhesive layer 26 and the first member 20 with a site corresponding to the plane region 28 as the starting point, and thereby progressively peeling the second member 22 from the first adhesive layer 26 and the first member 20. Note that "progressively" refers to the shape of the peeling gradually spreading from the site corresponding to the plane region 28, but not specifically to the speed of the peeling (hereinafter is the same).

With the embodiment illustrated in FIGS. 5A to 5F, the processing step (FIG. 5D) includes a step for carrying out the process T on the first member 20. Further, the laser light irradiation step (FIG. 5E) includes a step for irradiating the laser light L on the photothermal conversion layer 24 through the first member 20. Furthermore, the peeling step (FIG. 5F) includes a step for applying the force F to the outer peripheral portion 20c of the first member 20 having the process T carried out, in a direction away from the second member 22 flexing the first member 20 in a direction away from the second member 22 with the site corresponding to the plane region 28 as the starting point, and thereby progressively peeling the first member 20 from the second member 22.

By irradiating the laser light L to the photothermal conversion layer 24 in the laser irradiating step (FIG. 4E, FIG. 5E) after carrying out the process T to the first member 20 or the second member 22 in the processing step (FIG. 4D, FIG. 5D) with respect to the first member 20 and the second member 22 that have the first main face 20a and the second main face 22a joined via the first adhesive layer 26 in the joining step (4C, 5C), as described above, the photothermal conversion layer 24 degrades and loses its layer shape, and transforms into a residual liquid substance 24' (FIG. 4F, FIG. 5F). In this state, the plane region 28 with the photothermal conversion layer 24 disposed is separated from the first adhesive layer 26 so that it is difficult to rejoin because the residual liquid substance 24' exists after the degradation of the photothermal conversion layer 24. Here, in the peeling step (FIG. 4F, FIG. 5F), by applying a force F to a site, particularly corresponding to the plane region 28, that is the outer peripheral portion 20c of the first member 20 or the outer peripheral portion 22c of the second member 22, in a direction away from the other member 20 or 22, and an interfacial peeling of the first adhesive layer 26 and the first main face 20a occurs with the plane region 28 not adhered the first adhesive layer 26 as the starting point, and the first member 20 and the second member 22 are mutually partially peeled.

In the peeling step (FIG. 4F, FIG. 5F), one of either of the members 20 or 22 with the process T carried out is bent by the force F in a direction away from the other member 20 or 22 with a site corresponding to the plane region 28 as the starting point. Therefore, after the first member 20 and the second member 22 are mutually partially peeled with the plane region 28 as the starting point, by continually applying the force F to the outer peripheral portion 20c or 22c, one of either the member 20 or 22 causes the progressive flexing towards the region of the outer edge 20b or 22b on the opposite side of the peeling starting point, and the interfacial peeling of the first adhesive layer 26 and the first main face 20a gradually spreads from the plane region 28 (FIG. 4F, FIG. 5F). When the entirety of the first main face 20a is interfacially peeled from the first adhesive layer 26, the first member 20 and the second member 22 are mutually completely peeled. During this time, by maintaining the adhering of the first adhesive layer 26 to the second main face 22a, the interfacial peeling of the first adhesive layer 26 and the first main face 20a proceeds smoothly, and the first member 20 is surely peeled from the second member 22.

According to the member processing method described above, the same affects as the member peeling method in FIG. 1A to 1E can be achieved. In other words, by irradiating the laser light L after the joining of the first main face 20a and the second main face 22a to the photothermal conversion layer 24 disposed on the first surface 20a before the first main face 20a and the second main face 22a are joined by the first adhesive layer 26, the plane region 28 not adhered to the first adhesive layer 26 can be formed along the outer edge 20b of the first main face 20a, and the first member 20 and the second member 22 can be mutually peeled with the plane region 28 as the starting point. During peeling, because the interfacial peeling of the first main face 20a and the first adhesive layer 26 proceeds from the plane region 28, the first member 20 and the second member 22 can mutually be surely and quickly peeled. Particularly in the peeling step, because either one of the members 20 or 22 with the process T carried out is bent in a direction away from the other member 20 or 22 with a site corresponding to the plane region 28 as the starting point, the interfacial peeling of the first main face 20a and the first adhesive layer 26 can easily and stably proceed from the plane region 28.

Further, because the photothermal conversion layer 24 is disposed not on the entirety of the first main face 20a of the first member 20, but on the plane region 28 along at least one portion of the outer edge 20b, the laser light L that degrades that photothermal conversion layer 24 may also be irradiated to only a site that corresponds to the plane region 28 of the first member 20 or the second member 22. By not irradiating the laser light L on the entirety of the first member 20 and the second member 22, effects of the radiant energy of the laser light L on the first member 20 or the second member 22 can be reduced. Furthermore, the materials of the photothermal conversion layer 24 can reduce the consumption of power and the like of the laser light L when irradiating the laser light L.

In one of the embodiments of FIGS. 4A to 4F or FIGS. 5A to 5F, in the disposing step (FIG. 4B, FIG. 5B), as with the configuration illustrated in FIGS. 2A to 2B and FIGS. 3A to 3B, the photothermal conversion layer 24 can be disposed in spot shapes on the plane region 28 in spot shapes along one portion of the outer edge 20*b* of the first main face 20*a*, or the photothermal conversion layer 24 can be disposed in an annular shape on the plane region 28 having an annular shape along the entirety of the outer edge 20*b* of the first main face 20*a*. Note that from the perspective of promoting the proceeding of the interfacial peeling of the first main face 20*a* and the adhesive layer 26, the annular photothermal conversion layer 24 can be disposed on the annular plane region 28 along the entirety of the outer edge 20*b* of the first main face 20*a*.

Figure 6:
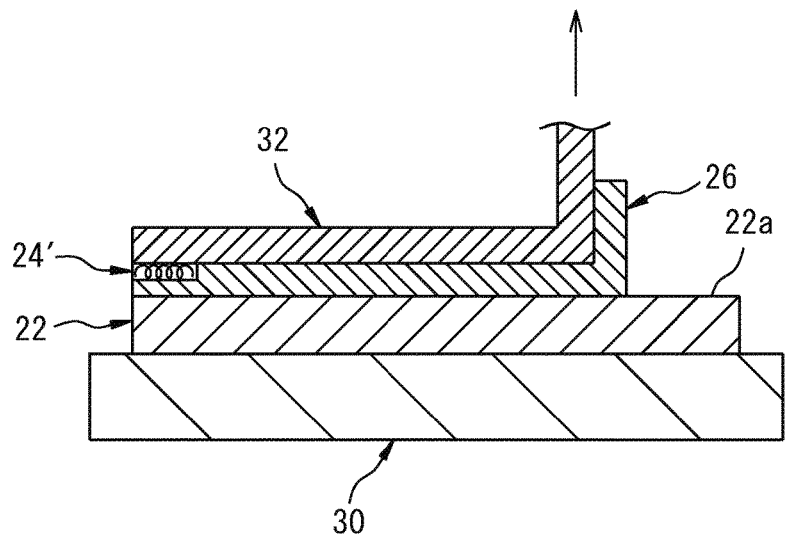
FIG. 6 is a cross-sectional view schematically illustrating one example of a supplementary step of the member processing method in FIGS. 4A to 4F and FIGS. 5A to 5F.

Moreover, in one of the embodiments of FIGS. 4A to 4F or FIGS. 5A to 5F, as illustrated in FIG. 6, after completely and mutually peeling the first member 20 and the second member 22, a step for separating the first adhesive layer 26 from the second main face 22*a* can be additionally included. This separating step, is performed by, for example, fixes the second member 22 to a jig 30 by vacuum suction or the like, adheres a peeling tape 32 to the first adhesive layer 26, and pulls the peeling tape 32 in a direction orthogonal to the second main face 22*a* by a 90 degree peeling device.

The member processing method described above can be suitably applied to a manufacturing method for a semiconductor chip that performs processes such as back surface grinding, film forming (for example, plating), and the like on the wafer supported on a support. For example, the semiconductor chip manufacturing method that applies the member processing method illustrated in FIGS. 4A to 4F includes a step for preparing a support (first member) 20 having a wafer support surface (first main face) 20*a* and a wafer (second member) 22 having a circuit surface (second main face) 22*a* including a circuit formation region (FIG. 4A), a step for disposing a photothermal conversion layer 24 degradable by laser light irradiation on a plane region 28 as one portion of the wafer support surface 20*a*, along at least one portion of the outer edge 20*b* of the wafer support surface 20*a* (FIG. 4B), a step for mutually joining the wafer support surface 20*a* with the photothermal conversion layer 24 disposed on the plane region 28 and the circuit surface 22*a* via an adhesive layer 26 so that the plane region 28 has a positional relationship that does not overlap the circuit formation region (FIG. 4C), a step for carrying out a required process T such as back surface grinding on the wafer 22 with the circuit surface 22*a* joined to the wafer support surface 20*a* (FIG. 4D), a step for irradiating a laser light L to the photothermal conversion layer 24 through the support 20 and degrading the photothermal conversion layer 24 (FIG. 4E), and a step for flexing the wafer 22 that had the process T carried out in a direction away from the wafer 22 with a site corresponding to the plane region 28 as the starting point, and peeling the wafer 22 from the support 20 while maintaining the adhesion of an adhesive layer 26 to the circuit surface 22*a* (FIG. 4F). The peeling step (FIG. 4F) includes a step for applying the force F to the outer peripheral portion 22*c* of wafer 22 with the process T carried out, in a direction away from the support 20.

According to the method for manufacturing a semiconductor chip described above, the same effects as the member processing method illustrated in FIGS. 4A to 4F can be achieved. In other words, by irradiating the laser light L after the joining of the wafer support surface 20*a* and the circuit surface 22*a* to the photothermal conversion layer 24 disposed on the wafer support surface 20*a* before the first wafer support surface 20*a* and the circuit surface 22*a* are joined by the first adhesive layer 26, the plane region 28 not adhered to the adhesive layer 26 can be formed along the outer edge 20*b* of the wafer support surface 20*a*, and the wafer 20 can be peeled from the support 20 with the plane region 28 as the starting point. During peeling, because the interfacial peeling of the wafer support surface 20*a* and the adhesive layer 26 proceeds from the plane region 28, the wafer 22 can be surely and quickly peeled from the support 20. Particularly in the peeling step, because the wafer 22 with the process T carried out is bent in a direction away from the support 20 with the site corresponding to the plane region 28 as the starting point, the interfacial peeling of the wafer support surface 20*a* and the adhesive layer 26 can easily and stably proceed from the plane region 28.

Further, because the photothermal conversion layer 24 is disposed not on the entirety of the wafer support surface 20*a* of the support 20, but on the plane region 28 along at least one portion of the outer edge 20*b*, the laser light L that degrades the photothermal conversion layer 24 may also be irradiated to only to the site that corresponds to the plane region 28 of the support 20 or the wafer 22. By not irradiating the laser light L on the entirety of the support 20 and the wafer 22, effects of the radiant energy of the laser light L on the support 20 or the wafer 22 (particularly the circuit formation region) can be reduced. Furthermore, the materials of the photothermal conversion layer 24 can reduce the consumption of power and the like of the laser light L when irradiating the laser light L. Note that the member processing method illustrated in FIGS. 5A to 5F can similarly apply to a method for manufacturing a semiconductor chip by defining the first member 20 as a wafer, and the second member 22 as a support.

FIGS. 7 to 13 illustrate one specific embodiment of the peeling step in the member processing method illustrated in FIGS. 4A to 4F. The peeling step according to this embodiment is, for example, a step for performing a process such as back surface grinding, film forming (for example, plating) on the grinder supported on the support in the method for manufacturing a semiconductor chip, and can be suitably adopted, but is not limited to this.

First, the configuration of a stacked body 40 (in other words, the component joined with the first member 20 and the second member 22 by the adhesive layer 26) that is the object of the peeling step according to the present embodiment will be additionally described.

The first member 20 is a flat plate-shaped element having the first main face 20*a* and a back surface 20*d* that are flat and extend substantially parallel to each other. The first member 20 can stably support the second member 22 on the first main face 20*a* without itself being deformed, and has rigidity that allows it to maintain its flat plate shape against external forces such as bending force transmitted from the second member 22 via the first adhesive layer 26. The first member 20 can be, for example, a substrate with large bending rigidity such as ceramic such as aluminum oxide, glass and the like, and plastic such as bakelite and the like.

The second member 22 is a flat plate-shaped element having the second main face 22a and a back surface 22d that are substantially flat and extend substantially parallel to each other. The second member 22 maintains its flat plate-shape against force applied in processes such as, for example, grinding and polishing on the back surface 22d while being joined to the first main face 20a of the first member 20 via the first adhesive layer 26, and has flexibility that can elastically flex relatively easily by an external force when individually peeled from the first member 20. The second member 22 can be, for example, a wafer or a substrate composed of silicon, gallium arsenide, crystal, glass, and the like.

When the second member 22 has a circular plate shape, the diameter of the second member 22 can be, for example, about 70 mm or greater, and, for example, about 500 mm or less.

Moreover, the thickness of the second member 22 can be, for example, about 0.01 mm or greater, and, for example, about 0.02 mm or greater, and can be, for example, about 0.2 mm or less, and, for example, about 0.1 mm or less. The second member 22 can easily flex with a predetermined curvature radius without suffering damage by an arbitrary external force by having this kind of relatively thin thickness even when it is a wafer or a substrate described above. The radius of the first member 20 can be substantially the same as the diameter of the second member 22 when the first member 20 has a circular plate shape. Furthermore, the thickness of the first member 20 is not limited to these, and can be changed depending on the material used for the first member 20 so that, for example, it is thinner when the bending rigidity of the material is larger and thicker when the bending rigidity of the material is smaller. Generally, the thickness of the first member 20 can be, for example, about 0.5 mm or greater, and, for example, about 1 mm or greater, and can be, for example, about 5 mm or less, and, for example, about 2 mm or less.

When applying the step of peeling the wafer having undergone a process of back surface grinding, film forming (for example, plating), and the like in the method for manufacturing a semiconductor chip for the illustrated peeling step, the second member 22 is the wafer 22 that becomes the base material of the semiconductor chip having undergone the process, and the second main face 22a is the circuit surface 22a including the circuit formation region that has a circuit pattern formed thereon, and the back surface 22d is the back surface 22d having undergone the process. When performing back surface grinding for the process, the thickness of the wafer 22 before the back surface grinding is, for example, about 0.5 mm to about 1 mm, and is standardized along with the diameter. Moreover, the thickness of the wafer 22 (or semiconductor chip) after processing that can apply the peeling step illustrated can be, for example, about 10 μm or greater, and, for example, about 30 μm or greater, and can be, for example, about 200 μm or less, and, for example, about 150 μm or less. On the other hand, the second member 20 is the support 20 that covers the circuit surface 22a of the wafer 22 during the processing step (FIG. 4D) and stably supports the wafer 22, and the first main face 20a is at least the flat wafer support surface 20a that can improve the parallelism of the back surface 22d of the circuit surface 22a of the wafer 22.

When the second member 22 is a wafer, there is generally no circuit pattern formed on the annular region along the outer edge 22b of the circuit surface 22a, and the inner side of this region becomes the circuit formation region. The annular region without a circuit pattern formed (called the blank region below) differs depending on the diameter and the like of the wafer 22, but generally is a region having a width of about 1 mm or greater, and 3 mm or less from the outer edge 22b towards the radial direction.

When the first member 20 is a support, an annular or spot-shaped (annular in the embodiment of FIGS. 7 to 13) plane region 28 is defined on a position along the outer edge 20b that corresponds to the blank region of the wafer 22. Therefore, when the support 20 has a circular plate shape with the same dimensions, the plane region 28 becomes a region having a width of about 1 mm or greater and about 3 mm or less from the outer edge 20 toward the radial direction. The photothermal conversion layer 24 (FIG. 4B) can be disposed on the plane region 28 using a coating method such as die coating, roll coating, and spin coating. The thickness of the photothermal conversion layer 24 disposed using a coating method can be, for example, about 0.1 μm or greater, and, for example, about 0.3 μm or greater, and can be, for example, about 2 μm or less, and, for example, about 1 μm or less. Particularly, with the configuration with the annular photothermal conversion layer 24 disposed on the annular plane region 28 along the entirety of the outer edge 20b of the wafer support surface 20a, not only is the proceeding of the interfacial peeling of the wafer support surface 20a and the adhesive layer 26 after the photothermal conversion layer has degraded promoted as described above, for example, when the stacked body 40 is exposed to a high temperature environment during the method for manufacturing a semiconductor, the annular photothermal conversion layer 24 acts to suppress heat deformation of the adhesive layer 26, and as a result, deterioration (such as the generation of cracks) of the adhesive layer 26 is prevented.

The second member 22 can have a general circular plate shape as a wafer, but may have, for example, a rectangular plate shape. The first member 20 can have a circular plate shape or a rectangular plate shape similar to the second member 22. The material, shape, dimensions, and the like of the first and second members 20 and 22 are not particularly limited with the exception of the requirement for the second member 22 to be individually relatively easy to flex and the first member 20 being able to substantially maintain its flat plane shape against external forces such as such as bending force transmitted from the second member 22. Note that when using a radiation-curable adhesive such as ultraviolet-curable adhesive (precursor), it is desirable for the first member 20 to have sufficient optical transparency. This transparency refers to, for example, transparency in a specific range of the electromagnetic spectrum that can apply to a curable adhesive (precursor) such as a spectrum in the ultraviolet range.

The first adhesive 26 can demonstrate an adhesive force that holds the firmly fixed state of the second main face 22a of the second member 22 to the first main face 20a of the first member 20 by curing or solidifying. For materials of the first adhesive layer 26, (a) a rubber adhesive with rubber, elastomer, and the like dissolved in a solvent, (b) a one liquid thermosetting adhesive with a base of epoxy, urethane, and the like, (c) a two-liquid mixing reactive adhesive with a base of epoxy, urethane, acrylic, and the like, (d) a hot-melt adhesive, (e) an ultraviolet or electron beam curable adhesive with a base of acrylic or epoxy, (f) a water-dispersible adhesive, and the like can be used. Particularly, an ultraviolet curable adhesive can be suitably used, and as materials, (i) an oligomer having a polymerizable vinyl group such as urethane acrylate, epoxy acrylate, and polyester acrylate, and (ii) a material with photopolymerization initiator and, if necessary, an additive added to at least one of acrylic or methacrylic monomer can be applied. Thickener, plasticizer, dispersant, defoamer, filler, flame retardant, heat antioxidant and the like can be used for the additive.

The first adhesive layer 26 is formed with a substantially uniform thickness across its entirety on the first main face 20a of the first member 20 and the second main face 22a of the second member 22, and preferably is glued to the entirety of both main faces 20a and 22a without any bubbles. The thickness of the first adhesive layer 26 can be, for example, about 0.001 mm or greater, for example, about 0.005 mm or greater, and, for example, about 0.010 mm or greater, and can be, for example, about 0.2 mm or less, for example, about 0.15 mm or less, and, for example, 0.1 mm or less. When the second member 22 is a wafer, the adhesive used for the adhesive layer 26 can, for example, be the same as the adhesive used for joining the support 20 for protecting and supporting to the circuit surface 22a during the back surface grinding step of the wafer 22. For example, one liquid ultraviolet-curable acrylic liquid adhesive LC-3200 (product name) available from Sumitomo 3M Co., Ltd. (Shinagawa-ku, Tokyo) can be used.

Figure 7:
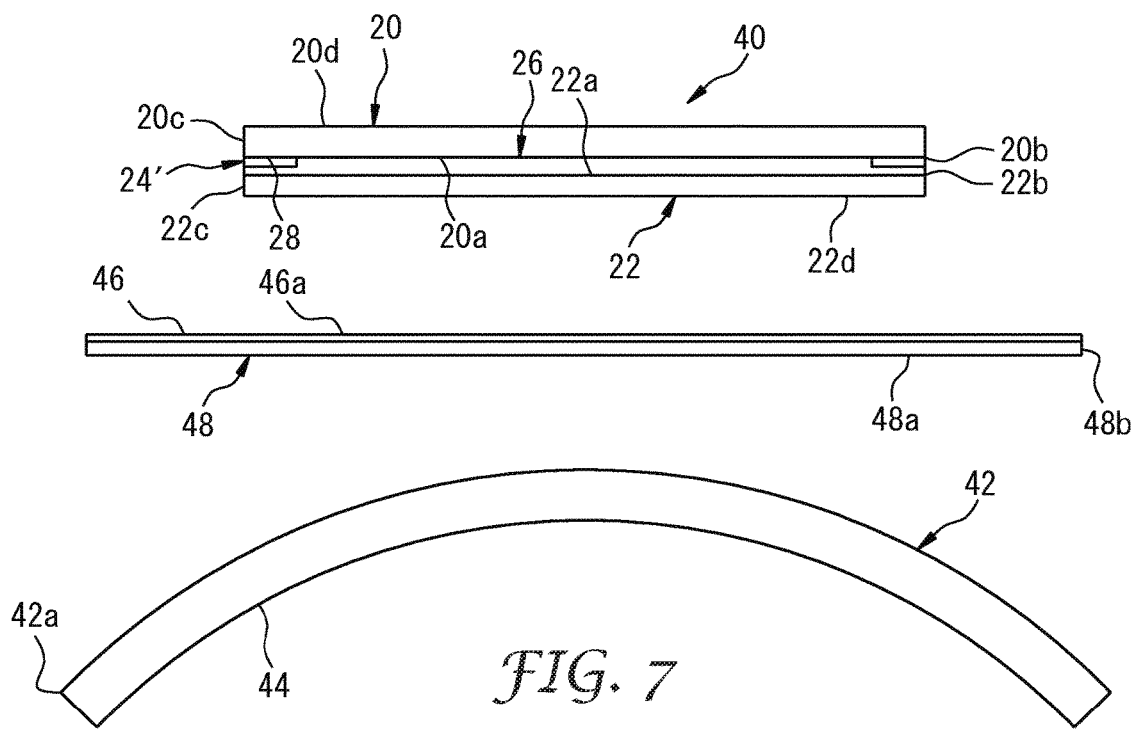
FIG. 7 is a cross-sectional view schematically illustrating one example of an embodiment of a peeling step of the member processing method in FIGS. 4A to 4F.
Figure 8:
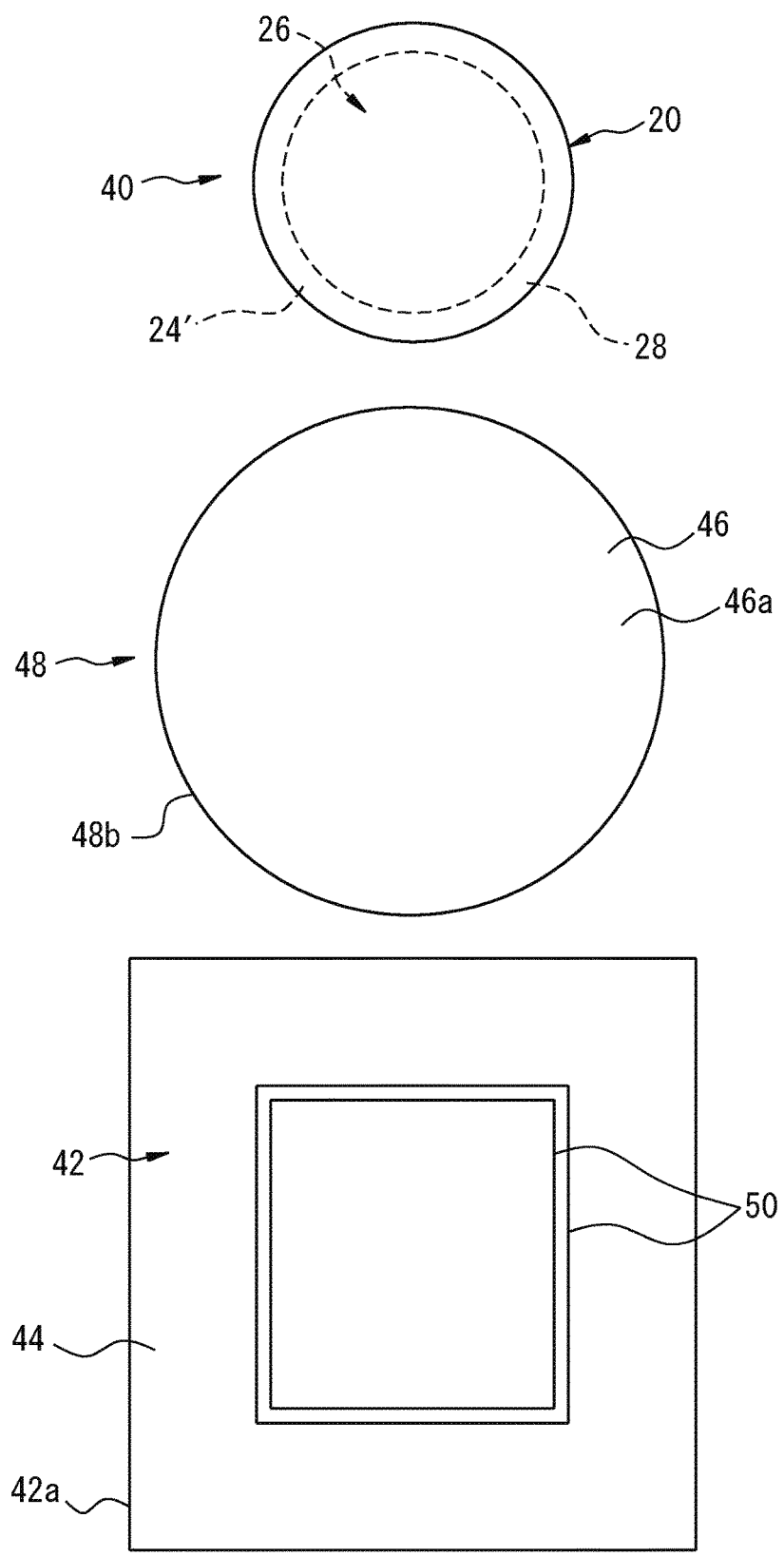
FIG. 8 is a plan view schematically illustrating the peeling step in FIG. 7.

The stacked body 40 is formed by superposing the first member 20 and the second member 22 that are substantially the same in dimension and shape but not in thickness, in a substantially coaxial disposal so that each main face 20a and 22a face each other substantially parallel, and by the first member 20a and the second member 22a are mutually joined by the first adhesive layer 26 interposed between the main faces 20a and 22a (FIG. 8 illustrates the stacked body having a circular plate external shape as an example). Furthermore, through the photothermal conversion layer degrading step (FIG. 4E) described above, the annular photothermal conversion layer 24 disposed on the annular plane region 28 transforms into the residual liquid substance 24', and the plane region 28 is not adhered to the first adhesive layer 26. The peeling step illustrated in FIGS. 7 to 13 is formed including the below steps from the stacked body 40.

i) Step for Preparing a Curved Support Surface 42

In step i, a curved support surface 42 is prepared as one portion of a cylindrical surface curved in a convex shape with a predetermined curvature. The predetermined supporting surface 42 has rigidity capable of maintaining the initial curvature against external forces. Alternatively, the predetermined supporting surface 42 has elasticity that is slightly deformable by external forces and capable of easily restoring the initial curvature. Further, the predetermined supporting surface 42 can be a substantially flat surface having fine irregularities. The curved support surface 42 is formed by the outer periphery of a hollow or solid cylindrical structure 44. An outer edge 42a of the curved support surface 42 can have various shapes such as a circular or rectangular shape when viewed from a planar view (FIG. 8 illustrates the curved support surface 42 having a rectangular outer edge 42a when viewed from a planar view as an example). The materials, shape, dimensions, and the like for the curved support surface 42 are not particularly limited with the exception of the requirement that it is larger than the back surface 22d of the second member 22 of the stacked body 40.

ii) Step for Preparing a Film 48 Having a Second Adhesive 46 (FIG. 7, FIG. 8)

In the step ii, the film 48 is prepared as a flexible film-like element having a second adhesive surface 46 and a back surface 48a on the opposite side, and an outer peripheral edge 48b. The second adhesive layer 46 is formed by uniformly imparting an adhesive on the entire surface of a film substrate composed of resin and the like, with uniform thickness. In the film 48, the adhesive force of the second adhesive layer 46 to the second member 22 of the stacked body 40 is larger than the adhesive force caused by the first adhesive layer 26 between the first member 20 and the second member 22. The adhesive that forms the second adhesive layer 46 can be a pressure sensitive adhesive that expresses an adhesive force that can hold the fixed state of back surface 22d of the second member 22 to the second adhesive layer 6.

After peeling the second member 22 from the first member 20 by a step described later, it may be necessary to peel the second member 22 from the second adhesive layer 46 of the film 48. In this case, an adhesive that reduces adhesive force by heating or radiation irradiation (for example, ultraviolet irradiation) can be used as the adhesive that forms the second adhesive layer 46. When using an adhesive that reduces adhesive force by, for example, radiation irradiation as the adhesive that forms the second adhesive layer 46, it is desirable for the film 48 to have sufficient radiotransparency, and, for example, the film 48 can be a polymer film composed of polyester such as polyethylene terephthalate, polyolefin resin such as polypropylene, polyvinyl chloride resin, polyvinyl chloride resin, polyamide resin, and the like. For example, T-172/Integrated Circuit Packaging Tape (product name) available from Sumitomo 3M Co., Ltd. (Shinagawa-ku, Tokyo), in other words a one-sided adhesive tape with acrylic adhesive applied on a polyolefin substrate can be used as the film 48 having the second adhesive layer 46 with a reduced adhesive force by radiation irradiation.

The adhesive that forms the second adhesive layer 46 is selected in combination with the adhesive that forms the first adhesive layer 26 with a requirement that the adhesive force between the second member 22 and the second adhesive layer 46 is larger than the adhesive force caused by the first adhesive layer 26 between the first member 20 and the second member 22. For example, when the first adhesive layer 26 is composed of ultraviolet curable adhesive LC-3200 (product name) available from Sumitomo 3M Co., Ltd. (Shinagawa-ku, Tokyo), the adhesive force of the first adhesive layer 26 to the main faces 20a and 22a of the first and second members 20 and 22 differs depending on the material and irregularities of the main faces 20a and 22a, but is in the range of generally 0.098 N/25 mm to 9.8 N/25 mm by a 90 degree healing test (JISZ0237-2009, 300 mm/min). In contrast, when the film 48 having the second adhesive layer 46 is composed of T-172M Integrated Circuit Packaging Tape (product name) available from Sumitomo 3M Co., Ltd. (Shinagawa-ku, Tokyo), the adhesive force of the second adhesive layer 46 to the back surface 22d of the second member 22 differs depending on the material and irregularities of the back surface 22d, but is in the range of generally 10 N/25 mm to 50 N/25 mm by a 90 degree healing test (JISZ0237-2009, 300 mm/min). Note that with T-172M Integrated Circuit Packaging Tape (product name), the adhesive force of the adhesive by radiation exposure (for example, radiation irradiation) is reduced to about 0.49 N/25 mm.

It is desirable for the adhesive force between the first member 20 and the second member 22 by the first adhesive layer 26 to be about 9.8 N/25 mm or less so that the second member 22 is not damaged when peeling the second member 22 from the first member 20. On the other hand, it is desirable for the adhesive force of the second adhesive layer 46 to the second member 22 to be about 14.7 N/25 mm or greater so that the second member 22 can be easily peeled from the first member 20. The difference between the adhesive force of the second adhesive layer 46 to the second member 22 and the adhesive force between the first member 20 and the second member 22 by the first adhesive layer can be, for example, about 4.9 N/25 mm or greater, for example, about 9.8 N/25 mm or greater, or, for example, about 14.7N/25 mm or greater.

When carrying out the disclosed peeling step in the method for manufacturing a semiconductor chip, it is desirable for the film 48 to have physical properties that can stably support the wafer (second member) 22 having undergone a process such as back surface grinding and peeled from the support (first member) 20 during a subsequent step (for example, dicing and the like). The thickness of this kind of film 48 can be, for example, 5 μm to 200 m.

Figure 9:
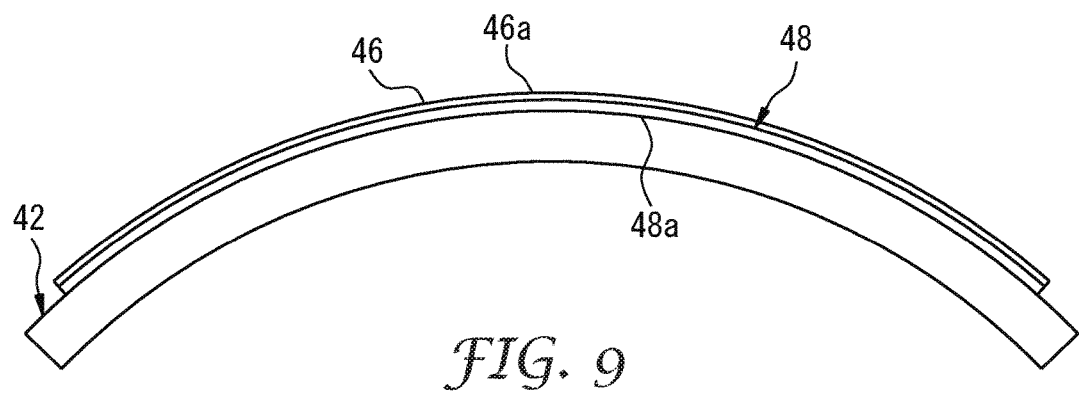
FIG. 9 is a side view schematically illustrating the peeling step in FIG. 7.

The film 48 may be supplied as a sheet previously cut to appropriate shape and dimensions, and may alternatively be continuously supplied fed from a roll (FIG. 8 illustrates the sheet-shaped film 48 cut externally in a circular plane shape as an example). The materials, shape, dimensions, and the like of the film 48 are not particularly limited with the exception of the requirement that the adhesive force of the adhesive layer 46 to the second member 22 is larger than the adhesive force caused by the first adhesive layer 26 between the first member 20 and the second member 22, and the requirement that the surface 46a (in other words adhesive surface) of the second adhesive layer 46 is larger than the back surface 22d of the second member 22 (thereby, the entirety of the back surface 22d of the second member 22 can be fixed to the adhesive surface 46a of the adhesive layer 46).

iii) Step for Fixing the Film 48 Along the Curved Support Surface 42 While the Adhesive Surface 46a of the Second Adhesive Layer 46 is Exposed (FIG. 9)

In step iii, in the film 48, the back surface 48a is glued and fixed to the adhesive layer 42 so that the adhesive surface 46a of the second adhesive layer 46 is a substantially flat curved surface along the curved support surface 42. The step for fixing the film 48 to the curved support surface 42 can have a step for applying a vacuum (herein, not limited to negative pressure lower than atmospheric pressure, decompression that is lower than the atmospheric pressure around the film 48 is referred to as a vacuum) to the film 48 and holding the film 48 for the curved support surface 42. In this case, various types of attachment mechanisms can be used that vacuum attach the film 48 to the curved support surface 42. According to a configuration where the film 48 is fixed to the curved support surface 42 using a vacuum, the film 48 can be easily separated from the curved support surface 42 by releasing the vacuum. When it is not deemed necessary to separate the film 48 from the curved support surface 42, the film 48 can also be fixed to the curved support surface 48 by an adhesive or the like, and in this case, a film 48 having an adhesive layer on both film substrates can be used. When the film 48 has an adhesive layer on both sides (one is the second adhesive layer 46), the adhesives that form these adhesive layers may be the same as the other, and may differ.

For the attachment mechanism described above, for example, a configuration can be applied being provided with a plurality of annularly formed grooves 50 (FIG. 8) having a predetermined width and depth (both, for example, about 1 mm to about 2 mm) on the desired position of the curved support surface 42 and a vacuum device (not illustrated) connected to the groove 50. According to this attachment mechanism, by operating the vacuum device and reducing the pressure in the groove 50 with the film 48 placed on the curved support surface 42 to cover the entirety of the groove 50, the film 48 can be adsorbed to the curved support surface 48 and fixedly held. Particularly, by reducing the pressure in the groove 50, the fine irregularities of the curved support surface 42 on the region surrounding the groove 50 similarly have the pressure reduced, and a portion of the film 48 positioned on the inner side of the grove 50 can be firmly fixed to the curved support surface 42. In this fixed state, by cancelling the operation of the vacuum device and returning the inside of the groove 50 to atmospheric pressure, the film 48 can be easily separated from the curved support surface 42. Assuming that the groove 50 is a closed annular shape, the groove 50 can extend in various shapes such as a circular or rectangular shape when viewed from a planar view (FIG. 8 illustrates two grooves 50 extending in a rectangular shape view from a planar view). The shape, dimensions, number, and the like of the groove 50 are not particularly limited with the exception of the requirement that at least one groove 50 extends to a region that can surround the entirety of the second member 22 of the stacked body 40. Note that in addition to the configuration described above having a groove 50, a configuration can be applied as an attachment mechanism where the entirety of the curved support surface 40 is a porous structure and the voids thereof are vacuumed.

iv) Step for Progressively Peeling the Second Member 22 from the First Member 20 (FIGS. 10 to 13)

Figure 10:
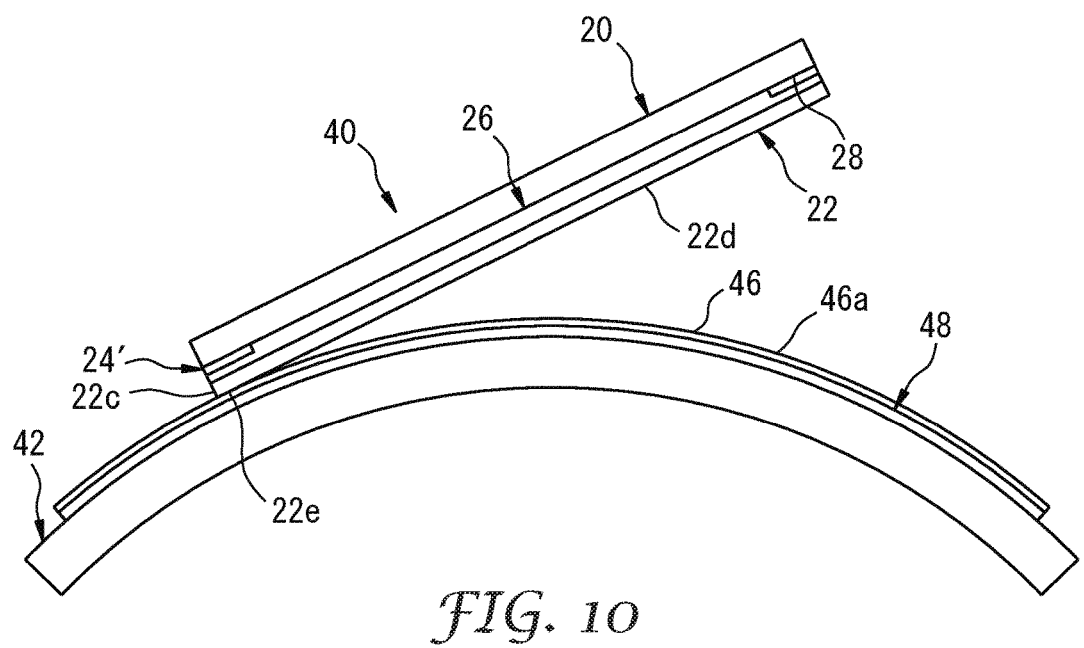
FIG. 10 is a side view schematically illustrating the peeling step in FIG. 7.
Figure 11A:
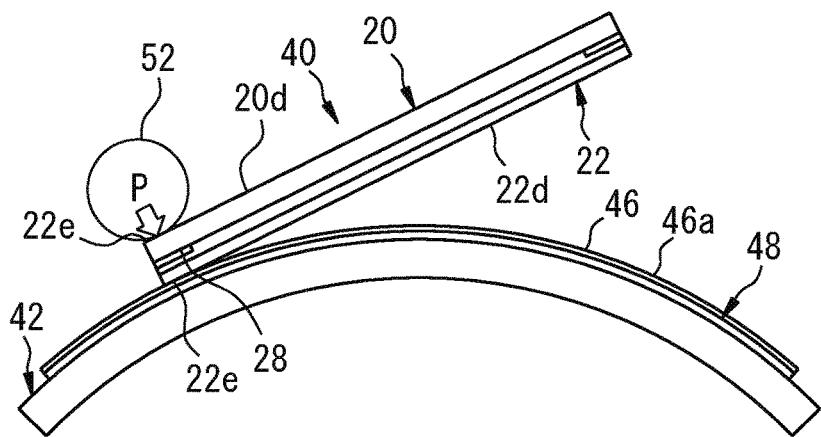
FIG. 11A is a side view schematically illustrating the peeling step in FIG. 7 as time elapses.

In step iv, first, one portion (hereby referred to as the first outer edge adjacent portion 22e) of the back surface 22d on the site that corresponds to the plane region 28 of the second member 22 joined to the first member 20 via the first adhesive layer 26 is brought into contact with and fixed to the adhesive surface 46a of the second adhesive layer 46 of the film 48 fixed on the curved support surface 42 (FIG. 10). Here, when using the attachment mechanism described above, a position where the back surface 22d initially contacts the adhesive surface 46a of the second adhesive layer 46 is determined so that the entirety of the back surface 22d of the second member 22 can finally be positioned on the region on the inner side of at least one groove 50. Further at this time, a pressing force P can be applied to the stacked body 40 in a direction that presses the back surface 22d of the second member 22 to the second adhesive layer 46 of the film 48 using a pressing member such as, for example, a rubber roller 52 (FIG. 11A). When the peeling step begins, the pressing force P is applied to a portion (hereby referred to as the first outer edge adjacent portion 20e) of the back surface 20d of the first member 20 on the site corresponding to the plane region 28. When the second adhesive layer 46 is formed by a pressure sensitive adhesive, the pressing force P is sufficiently large so that the adhesive force between the second adhesive layer 46 and the second member 22 is larger than the adhesive force caused by the first adhesive layer 26 between the first member 20 and the second member 22.

Figure 11B:
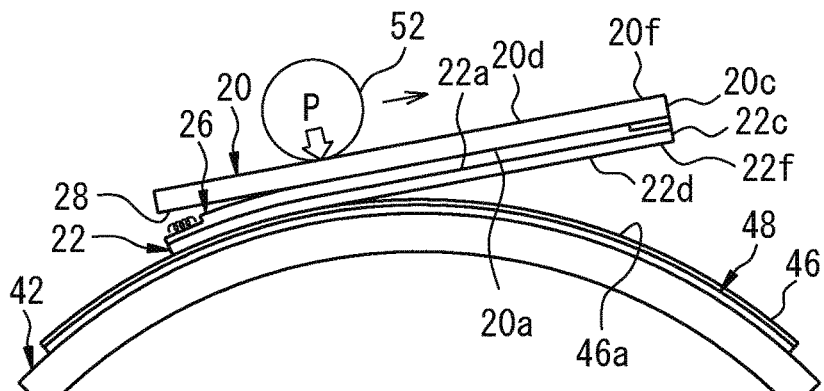
FIG. 11B is a side view schematically illustrating the peeling step in FIG. 7 as time elapses.

By, for example, rolling the rubber roller 52 along the back surface 20d of the first member 20 from the fixing position described above, the pressing force P applied to the stacked body 40 is continuously moved toward one portion (hereby referred to as the second outer edge adjacent portion 200 of the outer peripheral portion 20c on the opposite side from the first outer edge adjacent portion 20e of the back surface 20d (FIG. 11B). At this time, the pressing force P is applied uniformly across the entirety of a line-shaped division on the back surface 20d of the first member 20 extending in a direction orthogonal to the movement direction of the pressing force P. When using, for example the rubber roller 52, the rubber roller 52 is configured having an axial dimension larger than the greatest width of the back surface 20d of the first member 20 (the diameter of the back surface 20d when the first member 20 is a circular plane shape), and is configured so that the pressing force P can be uniformly applied to the entirety of the line-shaped division on the back surface 20d with the outer periphery of the rubber roller 52 abutting during the rolling along the back surface 20d. By moving the pressing force P in this manner, the back surface 22d of the second member 22 is progressively fixed to the adhesive surface 46a of the second adhesive layer 46 on the film 48 fixed on the curved support surface 42 towards one portion (hereby referred to as the second outer edge adjacent portion 22f) of the outer peripheral portion 22c on the opposite side from the first outer edge adjacent portion 22e.

Here, the adhesive force of the second adhesive layer to the second member 22 is larger than the adhesive force by the first adhesive layer 26 between the first member 20 and the second member 22, the second member 22 having individual flexibility that can flex relatively easy by an external force, and the first member 20 having rigidity that can maintain its flat shape against the bending force transmitted from the second member 22 via the first adhesive layer 26. Therefore, when the back surface 22d of the second member 22 is progressively fixed to the adhesive surface 46a of the second adhesive layer 46, the second member 22 progressively flexes along the curved support surface 42 while maintaining its fixed state to the second adhesive layer 46, and the first member 20 attempts to maintain its flat shape without flexing. As a result, the force F (FIG. 4F) is applied in a direction away from the first member 20 on the site corresponding to the plane region 28 of the outer peripheral portion 22c of the second member 22, interfacial peeling occurs between the first adhesive layer 26 and the first main face 20a with plane region 28 as the starting point, and the second member 22 is progressively peeled from the first member 20 with the first adhesive layer 26.

Figure 11C:
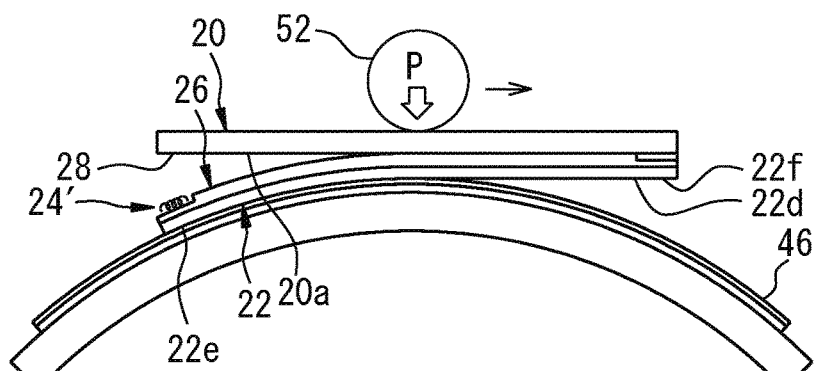
FIG. 11C is a side view schematically illustrating the peeling step in FIG. 7 as time elapses.
Figure 11D:
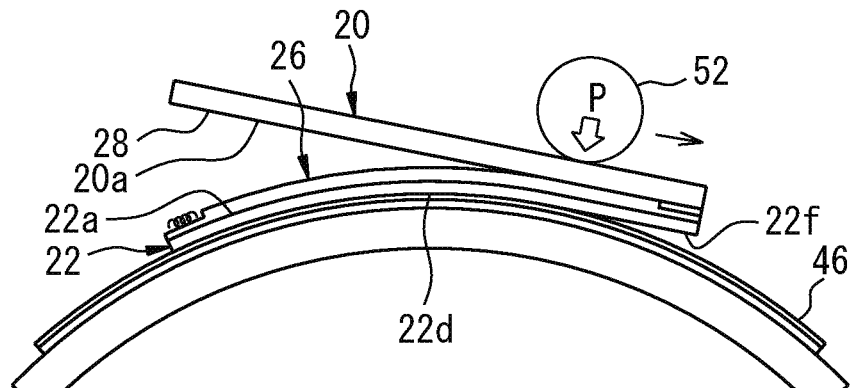
FIG. 11D is a side view schematically illustrating the peeling step in FIG. 7 as time elapses.
Figure 11E:
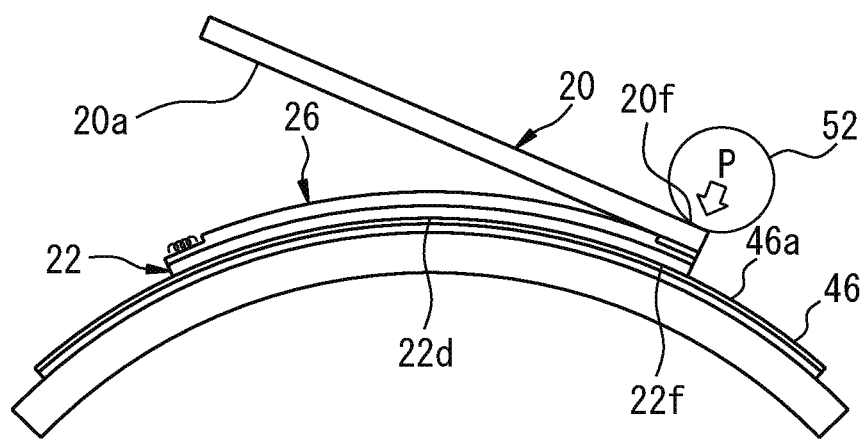
FIG. 11E is a side view schematically illustrating the peeling step in FIG. 7 as time elapses.
Figure 12:
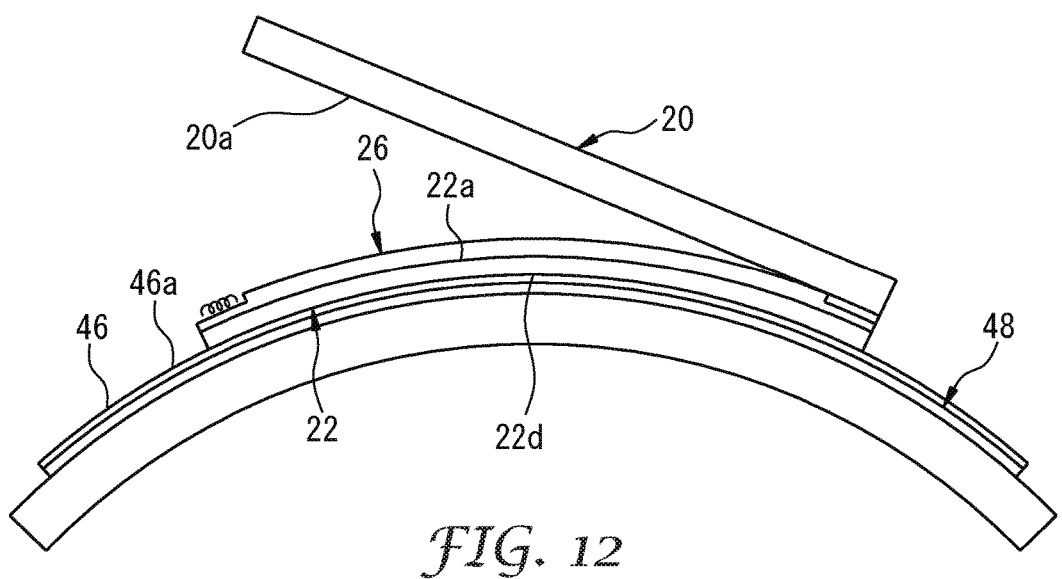
FIG. 12 is a side view schematically illustrating the peeling step in FIG. 7.
Figure 13:
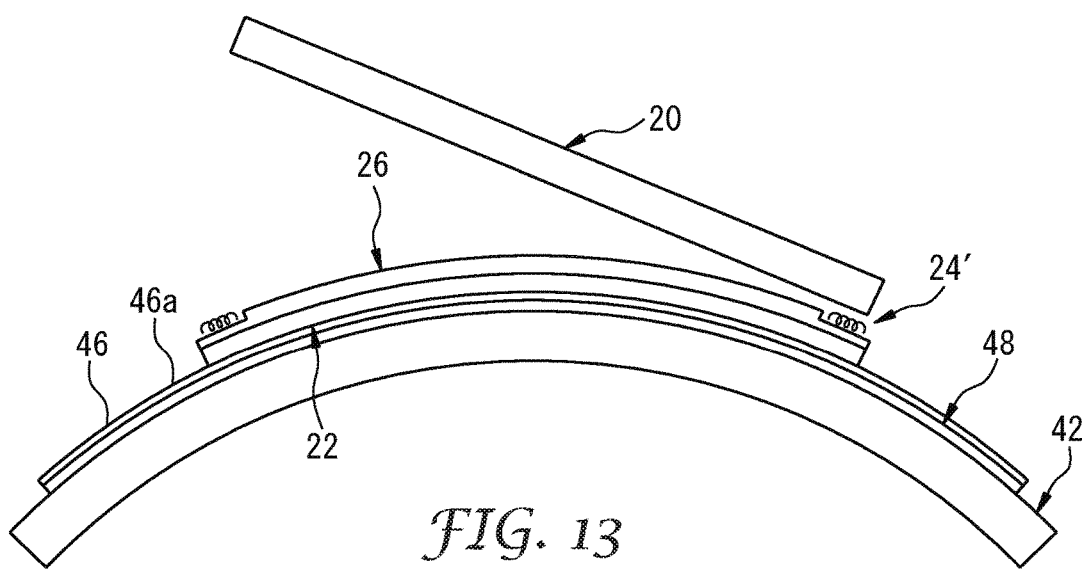
FIG. 13 is a side view schematically illustrating the peeling step in FIG. 7.
Figure 14:
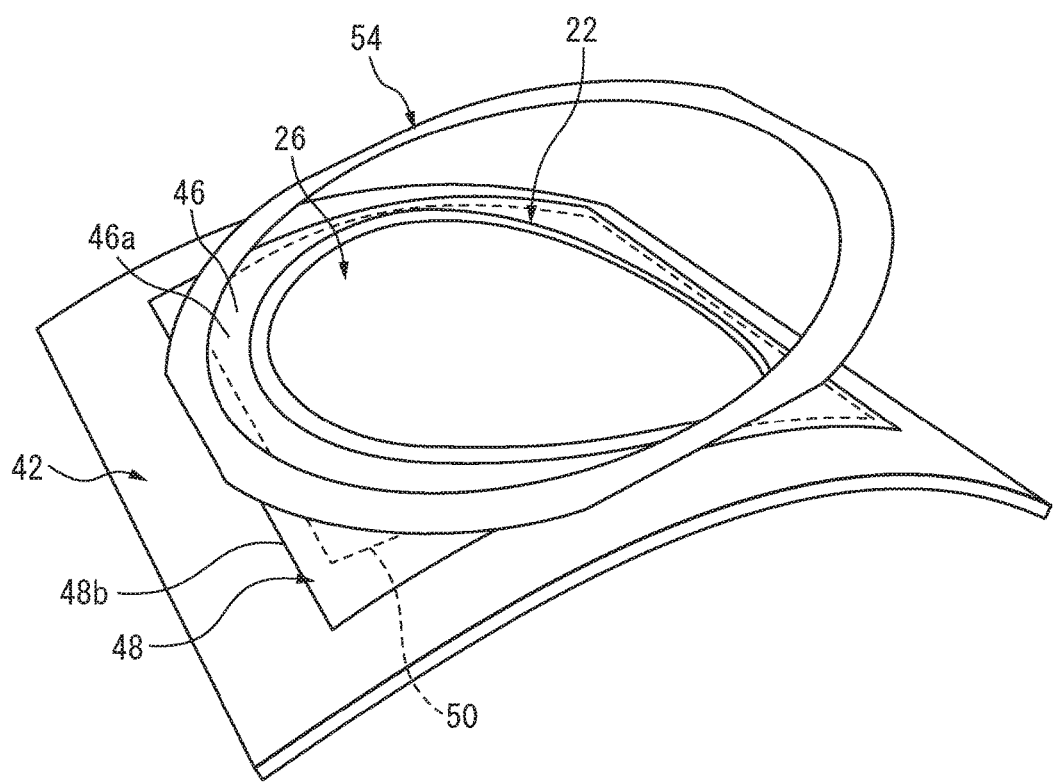
FIG. 14 is a perspective view schematically illustrating a supplementary step corresponding to the peeling step in FIG. 7.
Figure 15:
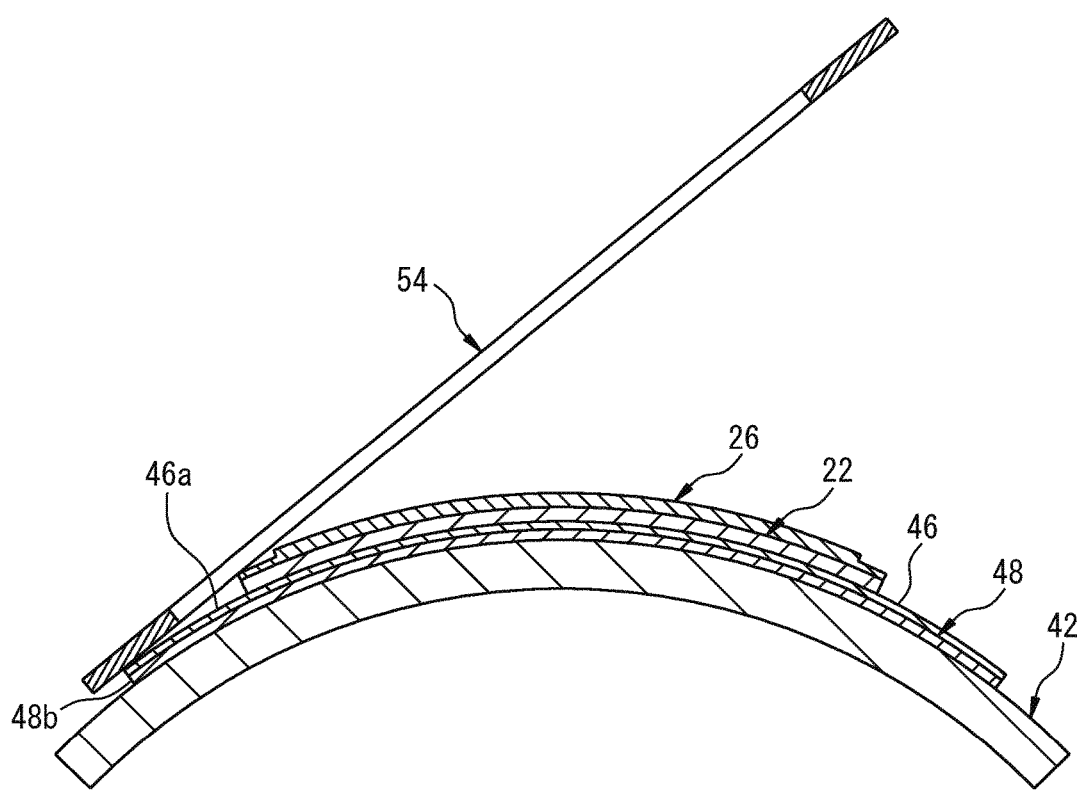
FIG. 15 is a cross-sectional view schematically illustrating the supplementary step in FIG. 14.

By continuously moving the pressing force P, the fixing of the back surface 22d of the second member 22 to the second adhesive layer 46 progressively proceeds toward the second outer edge adjacent portion 22f from the first outer edge adjacent portion 22e, and thereby, the peeling of the second member 22 from the first member 20 progressively proceeds along with the interfacial peeling of the first adhesive layer 26 and the first main face 20a (FIGS. 11C and 11D). At this time, the interfacial peeling of the first adhesive layer 26 and the first main face 20a is promoted by the existence of the annular plane region 28 not adhered to the first adhesive layer 26. When the pressing force P reaches the second outer edge adjacent portion 20f of the back surface 20d of the first member 20, the entirety of the back surface 22d of the second member 22 is fixed to the adhesive surface 46a of the second adhesive layer 46 (FIG. 11E). Then, the pressing force is removed (FIG. 12), and the entirety of the second member 22 is peeled from the first member 20 along with the first adhesive layer 26 by pulling the first member 20 apart from the second member 22 if necessary (FIG. 13).

According to the peeling step described above, the second member 22 can be progressively peeled from the first member 20 by simply progressively fixing the second member 22 of the stacked body 40 to the second adhesive layer 46 of the film 48 fixed to the curved support surface 42, and by continuing this progressive step and fixing the entirety of the second member 22 to the second adhesive layer 46, the entirety of the second member 22 can be peeled from the first member 20 along with the first adhesive layer 26. Therefore, a process for melting the first adhesive layer 26 or reducing the adhesive force becomes unnecessary, and the first and second members 20 and 22 can be quickly and safely peeled mutually with a simpler method.

Further, the peeling step described above can be carried out as a step for peeling the wafer (second member) 22 from the support (first member) 20 joined to the circuit surface (second main face) 22a of the wafer 22 in the method for manufacturing a semiconductor chip. According to this configuration, the wafer 22 can be more quickly and safely peeled from the support 20 along with the adhesive layer 26 without melting the first adhesive layer 26 or reducing the adhesive force.

In the peeling step described above for peeling from the first member 20 by flexing the second member 22 along the curved support surface 42, it is necessary to flex the second member 22 to the limit of the curvature radius or lower to the extent that damage does not occur. Particularly, when the second member 22 is a wafer, it is required that a semiconductor device or circuit formed on the circuit surface (second main face) 22a of the wafer (second member) 22 does not suffer damage from the deformation (stretching) of the circuit surface 22a. The deformation (stretching) amount of the second main face 22a when the second member 22 is bent to a predetermined curvature radius is proportional to the width of the second member 22, and inversely proportional to the curvature radius. From this perspective, the curvature radius of the curved support surface 42 can be defined as about 2,000 times or greater, or about 4,000 times or greater than the width of the second member 22 in the peeling step described above. Further, to carry out quickly and smoothly the step for progressively peeling the second member 22 from the first member 20, the curvature radius of the curved support surface 42 can be about 10,000 times or less, or about 8,000 times or less the width of the second member 22.

In the peeling step described above, to make it possible for the second member 22 to be peeled from the first member 20 while maintaining the adhered state of the first adhesive layer 26 to the main face 22a, various means can be applied that make the adhesive strength of the first adhesive layer 26 to the first main face 20a of the first member 20 larger than the adhesive strength of the first adhesive layer 26 to the second main face 22a of the second member 22. As one example of this type of means, the selection of materials of the first and second members 20 and 22 can be given, and, for example, the first member 20 is formed by a plastic such as bakelite, and the second member 22 can be formed by wafer materials such as silicon. Further, as another example of the means described above, a surface process for reducing the adhesive strength of the first adhesive layer 26 to the first main face 20a of the first member 20 can be carried out beforehand on the first main face 20a, and a surface process for increasing the adhesive strength of the first adhesive layer 26 to the second main face 22a of the second member 22 can be carried out beforehand on the second main face 22a.

In the peeling step described above, after the entirety of the second member 22 is peeled from the first member 20, separating the film 48 from the curved support surface 42 along with the second member 22 fixed on the adhesive surface 46a of second adhesive layer 46 may be additionally required. FIGS. 14 to 17 illustrate this kind of supplementary step. Note that in FIG. 14, the sheet-shaped film 48 cut externally in a rectangular shape is fixed to the curved support surface 42 having one groove 50 extending in a rectangular shape when viewed from a planar view, and the circular plate shaped second member 22 with the first adhesive layer 26 adhered on the region is fixed on the inner side of the groove 50.

The illustrated supplementary step is a step for separating the film 48 from the curved support surface 42 along with the second member 22 fixed on the adhesive surface 46a of the second adhesive layer 46 after the entirety of the second member 22 is peeled from the first member 20, and includes the following steps.

v) Step for fixing an annular frame member 54 having a shape that surrounds the second member 22 to the adhesive surface 46a of the second adhesive layer 46 on the film 48 around the second member 22 (FIGS. 14 to 16D).

The frame member 54 is manufactured with a width uniform along its entirety from metal, resin, and the like, and has rigidity that can stably support on the extended film 48 the second member 22 positioned on the inner side of the frame member 54 by fixing it on the second adhesive layer 46 along the outer peripheral portion 48b of the film 48. For example, when the frame member 54 is an annular shape of stainless steel, dimensions can be had with the width being about 1 mm to 2 mm, the inner diameter being about 350 mm, and the outer diameter being about 400 mm. These dimensions apply to when, for example, the second member 22 is a silicon wafer with a diameter of 300 mm. Note that the illustrated frame member 54 has an annular shape similar to the circular plate shape of the second member 22, and with the exception of having a shape and dimensions that can surround the entirety of the second member 22 via a gap, and of having rigidity that can stably support the second member 22 on the extended film 48, the material, shape, dimensions, and the like of the frame member 54 are not particularly limited.

Figure 16A:
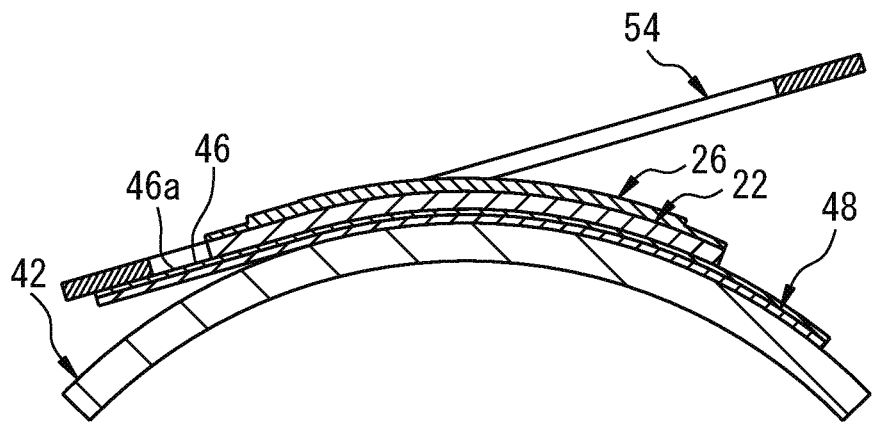
FIG. 16A is a cross-sectional view schematically illustrating the supplementary step in FIG. 14 as time elapses.
Figure 16B:
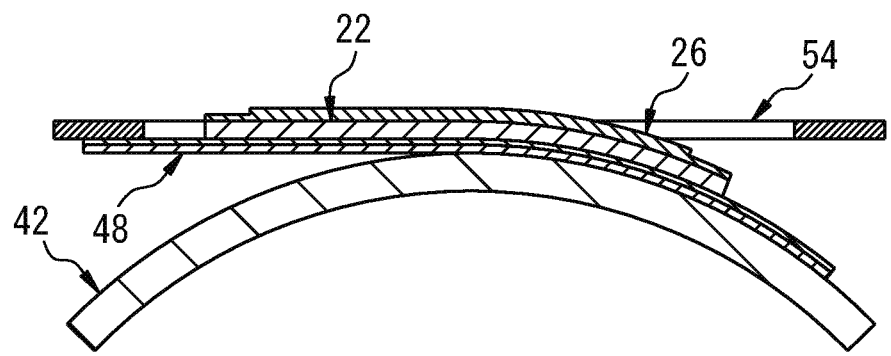
FIG. 16B is a cross-sectional view schematically illustrating the supplementary step in FIG. 14 as time elapses.
Figure 16C:
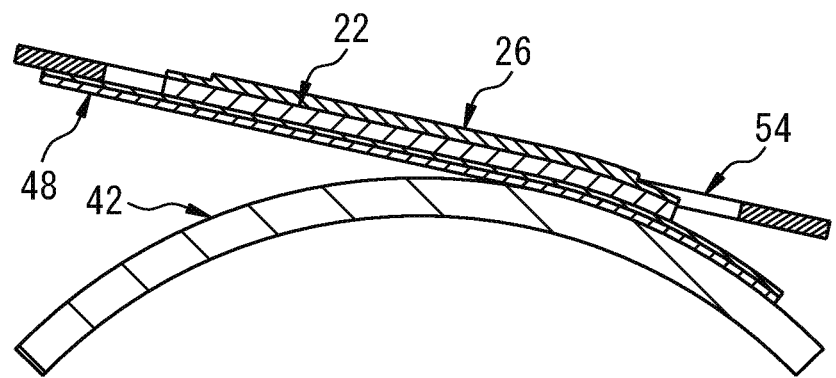
FIG. 16C is a cross-sectional view schematically illustrating the supplementary step in FIG. 14 as time elapses.
Figure 16D:
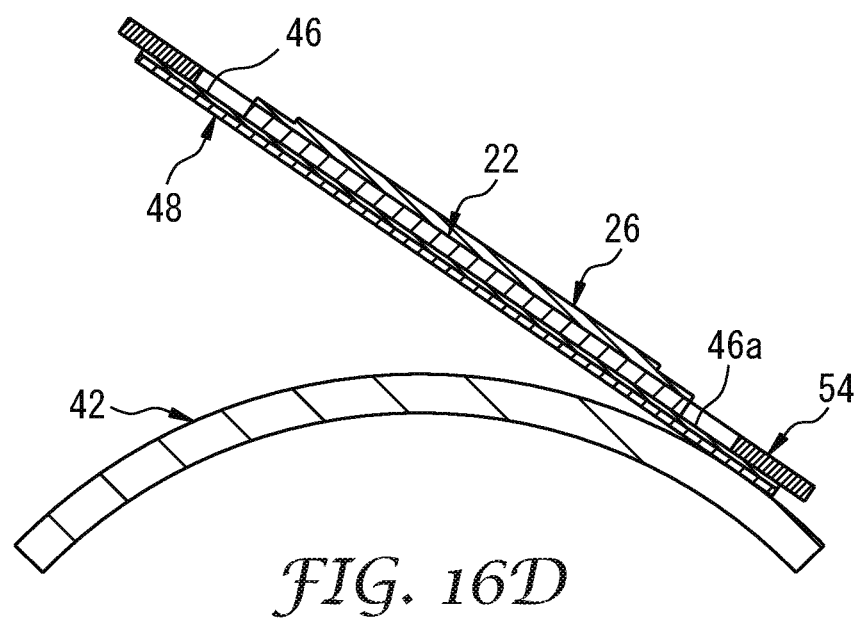
FIG. 16D is a cross-sectional view schematically illustrating the supplementary step in FIG. 14 as time elapses.
Figure 17:
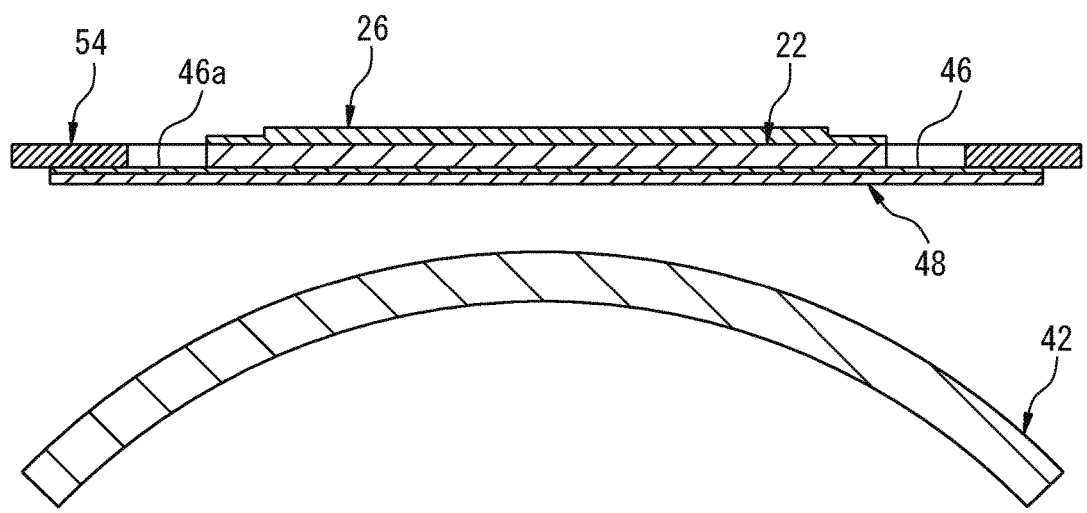
FIG. 17 is a cross-sectional view schematically illustrating the supplementary step in FIG. 14.

In step V, first, a portion of the annular frame member 54 is brought into contact with and is fixed to the adhesive surface 46a of the second surface adhesive 46 of the film 48. At this time, the position where the frame 54 first contacts the adhesive surface 46a of the second adhesive layer 46 is determined so that the entirety of the second member 22 is finally surrounded by the frame member 54. Also at this time, a pressing force to the direction that the frame member 54 is pressed to the second adhesive layer 46 can be applied to the frame member 54. Note that before and after this step, for example, by releasing the vacuum of the attachment mechanism described above, the film 48 becomes not fixed to the curved support surface. In addition, the frame member 54 is progressively fixed to the adhesive surface 46a of the second adhesive layer 46 towards a portion on the opposite side from the initial fixing portion.

vi) Step for Moving the Frame Member 54 Fixed on the Adhesive Surface 46a of the Second Adhesive Layer 46 in a Direction Away from the Curved Support Surface 42 (FIGS. 16A to 17)

A portion of step vi is performed along with the progressive fixing step v of the frame member 54 described above. In other words, when the frame member 54 having rigidity that can stably support the second member 22 on the extended film 48 when it is progressively fixed to the adhesive surface 46a of the second adhesive layer 46 towards a portion on the opposite side from the initial fixing portion holds its own shape, the portion fixed to the second adhesive layer 46 progressively moves in a direction away from the curved support surface 42 along with the film 84 and the second member 22.

With the entirety of the frame member 54 fixed to the second adhesive layer 46 (FIG. 16D), the frame member 54 with the second member 22 stably supported on the extended film 48 independent from the curved support surface 42 and can move freely. In this manner, the film 48 is separated from the curved support surface 42 along with the second member 22 fixed to the second adhesive layer 46 (FIG. 17). The film 48 separated using the frame member 54 from the curved support surface 42 along with the second member 22 holds its flat, extending, state by the frame member 54, and thereby, for example, a desired operation such as the separating step of the first adhesive layer 26 (FIG. 2), a processing, a transportation, and the like can be stably carried out on the second member 22 peeled from the first member 20.

When the illustrated peeling step is carried out in the step for peeling a wafer having a back surface grinding performed in the manufacturing method of a semiconductor chip, the supplementary step described above is a step for separating the film 48 from the curved support surface 42 along with the wafer 22 fixed on the second adhesive layer 46 after peeling the entirety of the wafer (second member) 22 from the support (first member) 20, and includes a step for fixing the annular frame member 54 having a shape that surrounds the wafer 22 to the adhesive surface 46a of the second adhesive layer 46 on the film 48 around the wafer 22, and a step for moving the frame member 54 fixed on the adhesive surfaces 46a of the second adhesive surface 46 in a direction away from the curved support surface 42. According to a manufacturing method having this type of supplementary step, processes such as the separation, dicing, and the like of the adhesive layer 26 can be easily carried out on the wafer (second member) 22 fixed on the film 48 with its extended state held by the frame member 54.

In the peeling step described above, the step for fixing the film 48 to the curved support surface 42 can include a step for continuously fixing a web-shaped film 48 to the curved support surface 42 that is continuously moving. Furthermore, the step for progressively peeling the second member 22 from the first member 20 is configured to perform in order of the first member 20 and the second member 22 mutually joined via the first adhesive layer 26 to the plurality of stacked bodies 40 of each using the film 48 continuously fixed on the curved support surface. According to this type of configuration, each second member 22 joined via the first adhesive layer 26 can be continuously peeled from the plurality of first members 20 by a continuous operation of the plurality of stacked bodies 40.

Note that the peeling step described above can be carried out similarly in the member processing method illustrated in FIGS. 5A to 5F by exchanging and applying the first member 20 and the second member 22.

DESCRIPTION OF THE REFERENCE NUMERALS 10, 20 First member
10a First main face
10b, 20b Outer edge
10c, 20c Outer peripheral portion
12, 22 Second member
12a Second main face
12b, 22b Outer edge
12c, 22c Outer peripheral portion
14, 24 Photothermal conversion layer
16 Adhesive layer
18, 28 Plane region
20a First main face
22a Second main face
26 First adhesive layer 42 Curved support surface
46 Second adhesive layer
48 Film
54 Frame member

What is claimed is:

1. A member peeling method, comprising:
  a step for preparing a first member having a first main face and a second member having a second main face;
  a step for disposing a photothermal conversion layer on at least a portion of an outer edge of the first main face and the photoconversion layer is not disposed on the entirety of the first main face of the first member;
  a step for mutually joining the first main face and the second main face via an adhesive layer so that the photothermal conversion layer is disposed between the first main face and the second main face;
  a step for irradiating a laser light to the photothermal conversion layer;
  a step for at least partially peeling the first member from the second member by applying a force to an outer peripheral portion of either member of the first member or the second member in a direction away from the other member of the first member or second member.

2. The member peeling method according to claim 1, wherein the photothermal conversion layer is disposed along the entire outer edge of the first main face.

3. The member peeling method according to claim 1, wherein an adhered state between the adhesive layer and the second main face is maintained during the peeling step.

4. The member peeling method according to claim 1 wherein the first member is completely peeled from the second member.

5. A member processing method, comprising:
  a step for preparing a first member having a first main face and a second member having a second main face;
  a step for disposing a photothermal conversion layer, degradable by laser light irradiation, in a plane region along at least a portion of an outer edge of the first main face, the plane region being a portion of the first main face and the photoconversion layer is not disposed on the entirety of the first main face of the first member;
  a step for mutually joining the first main face, where the photothermal conversion layer is disposed on the plane region, and the second main face via a first adhesive layer;
  a step for carrying out a required process to either member of the first member or the second member where the first main face and the second main face are joined;
  a step for irradiating a laser light onto the photothermal conversion layer through the first member or the second member, and degrading the photothermal conversion layer; and
  a step for mutually peeling the first member and the second member, with a site corresponding to the plane region as a starting point, by flexing either one of the members in a direction away from the other member of the first or second member, while the first adhesive layer maintains an adhered state to the second main face.

6. The member processing method according to claim 5, wherein the step for disposing includes a step for disposing the photothermal conversion layer, having an annular shape, on the plane region, having an annular shape, along an entire outer edge of the first main face.

7. The member processing method according to claim 5, wherein the step for carrying out a process includes a step for carrying out the process on the second member, and the step for peeling includes a step for flexing the second member in a direction away from the first adhesive layer and the first member with the site as a starting point.

8. The member processing method according to claim 5, wherein the step for peeling includes,
  a step for preparing a curved support surface;
    a step for preparing a film, the film having a second adhesive layer, where an adhesive force between the second adhesive layer and either of the members is greater than an adhesive force between the first member and the second member by the first adhesive layer;
    a step for fixing the film to extend along the curved support surface while the surface of the second adhesive layer is exposed;
  a step for peeling either one of the members away from the other member, by securing the exposed surface of either member joined to the other member via the first adhesive layer to the surface of the second adhesive layer of the film fixed to the curved support surface, and by flexing either one of the members to extend along the curved support surface.

9. The member processing method according to claim 5, further comprising a step, after the first member and the second member are mutually and completely peeled, for separating the first adhesive layer from the second main face.

10. A method for manufacturing a semiconductor chip, the method comprising:
  a step for preparing a support having a wafer support surface and a wafer having a circuit surface including a circuit formation region;
  a step for disposing a photothermal conversion layer, degradable by laser light irradiation, in a plane region along at least a portion of an outer edge of the wafer support surface, the plane region being the wafer support surface and the photoconversion layer is not disposed on the entirety of the wafer support surface;
  a step for mutually joining the wafer support surface, where the photothermal conversion layer is disposed in the plane region, and the circuit surface via the adhesive layer in a positional relationship where the plane region does not overlap with the circuit formation region;
  a step for carrying out a required process on the wafer where circuit surface is joined to the wafer support surface;
  a step for irradiating a laser light onto the photothermal conversion layer through the support, and degrading the photothermal conversion layer; and
  a step for peeling the wafer from the support, by flexing the wafer in a direction away from the support, while the adhesive layer maintains an adhered state on the circuit surface, with a site corresponding to the plane region as a starting point.

11. A member processing method, comprising:
  a step for preparing a first member having a first main face and a second member having a second main face;
  a step for disposing a photothermal conversion layer, degradable by laser light irradiation, in a plane region along at least a portion of an outer edge of the first main face, the plane region being a portion of the first main face;
a step for mutually joining the first main face, where the photothermal conversion layer is disposed on the plane region, and the second main face via a first adhesive layer;

a step for carrying out a required process to either member of the first member or the second member where the first main face and the second main face are joined;

a step for irradiating a laser light onto the photothermal conversion layer through the first member or the second member, and degrading the photothermal conversion layer; and a step for mutually peeling the first member and the second member, with a site corresponding to the plane region as a starting point, by flexing either one of the members in a direction away from the other member of the first or second member, while the first adhesive layer maintains an adhered state to the second main face, wherein the step for disposing includes a step for disposing the photothermal conversion layer, having an annular shape, on the plane region, having an annular shape, along an entire outer edge of the first main face.

12. A member processing method, comprising:

a step for preparing a first member having a first main face and a second member having a second main face;

a step for disposing a photothermal conversion layer, degradable by laser light irradiation, in a plane region along at least a portion of an outer edge of the first main face, the plane region being a portion of the first main face;

a step for mutually joining the first main face, where the photothermal conversion layer is disposed on the plane region, and the second main face via a first adhesive layer;

a step for carrying out a required process to either member of the first member or the second member where the first main face and the second main face are joined;

a step for irradiating a laser light onto the photothermal conversion layer through the first member or the second member, and degrading the photothermal conversion layer; and a step for mutually peeling the first member and the second member, with a site corresponding to the plane region as a starting point, by flexing either one of the members in a direction away from the other member of the first or second member, while the first adhesive layer maintains an adhered state to the second main face, wherein the step for peeling includes, a step for preparing a curved support surface;

a step for preparing a film, the film having a second adhesive layer, where an adhesive force between the second adhesive layer and either of the members is greater than an adhesive force between the first member and the second member by the first adhesive layer;

a step for fixing the film to extend along the curved support surface while the surface of the second adhesive layer is exposed;

a step for peeling either one of the members away from the other member, by securing the exposed surface of either member joined to the other member via the first adhesive layer to the surface of the second adhesive layer of the film fixed to the curved support surface, and by flexing either one of the members to extend along the curved support surface.

\* \* \* \* \*